(12) United States Patent
Kawaguchi et al.

(10) Patent No.: US 8,134,084 B2
(45) Date of Patent: Mar. 13, 2012

(54) NOISE-SUPPRESSING WIRING-MEMBER AND PRINTED WIRING BOARD

(75) Inventors: Toshiyuki Kawaguchi, Tokyo (JP); Kazutoki Tahara, Saitama (JP); Tsutomu Saga, Saitama (JP); Mitsuaki Negishi, Kitakatsushika-gun (JP)

(73) Assignee: Shin-Etsu Polymer Co., Ltd. (JP)

( * ) Notice: Subject to any disclaimer, the term of this patent is extended or adjusted under 35 U.S.C. 154(b) by 901 days.

(21) Appl. No.: 11/769,386

(22) Filed: Jun. 27, 2007

(65) Prior Publication Data

US 2008/0049410 A1 Feb. 28, 2008

(30) Foreign Application Priority Data

Jun. 30, 2006 (JP) ................................. 2006-181179
Jul. 21, 2006 (JP) ................................. 2006-199286

(51) Int. Cl.
*H05K 1/11* (2006.01)
(52) U.S. Cl. ........ 174/262; 174/397; 361/761; 361/748; 361/736; 361/722
(58) Field of Classification Search .................. 361/761, 361/748, 736, 722; 174/397
See application file for complete search history.

(56) References Cited

U.S. PATENT DOCUMENTS 5,561,584 A 10/1996 Tang .............................. 361/220
(Continued)

FOREIGN PATENT DOCUMENTS

EP 1 130 950 9/2001
(Continued)

OTHER PUBLICATIONS

Official Action issued on counterpart Korean Patent Application No. 10-2009-7001706 dated Oct. 18, 2010 with a English translation.

(Continued)

*Primary Examiner* — Kambiz Zand
*Assistant Examiner* — Abiy Getachew
(74) *Attorney, Agent, or Firm* — Ostrolenk Faber LLP

(57) ABSTRACT

The present invention relates to a wiring member including: a copper foil layer having a smooth surface with a surface roughness Rz of 2 µm or less; a noise suppressing layer containing a metallic material or a conductive ceramic and having a thickness of 5 to 200 nm; and an insulating resin layer provided between the smooth surface of the copper foil layer and the noise suppressing layer, and also relates to a printed wiring board equipped with the wiring member. Moreover, the present invention relates to a noise suppressing structure including: a first conductive layer; a second conductive layer; a noise suppressing layer provided between the first conductive layer and the second conductive layer, the noise suppressing layer being to be electromagnetically-coupled with the first conductive layer, the noise suppressing layer comprising a metallic material or a conductive ceramic, and the noise suppressing layer having a thickness of 5 to 300 nm; a first insulating layer provided between the first conductive layer and the noise suppressing layer; and a second insulating layer provided between the second conductive layer and the noise suppressing layer; wherein the noise suppressing structure has: a region (I) in which the noise suppressing layer and the first conductive layer face each other; and a region (II) in which the noise suppressing layer and the first conductive layer do not face each other but the noise suppressing layer and the second conductive layer face each other, the regions (I) and (II) neighboring each other.

12 Claims, 14 Drawing Sheets

U.S. PATENT DOCUMENTS

| | | | |
|---|---|---|---|
| 5,966,294 A | 10/1999 | Harada et al. | 361/794 |
| 6,556,453 B2 * | 4/2003 | Figueroa et al. | 361/763 |
| 2004/0146452 A1 | 7/2004 | Fujieda et al. | |
| 2005/0048306 A1 | 3/2005 | Suzuki et al. | 428/548 |
| 2006/0083948 A1 * | 4/2006 | Kawaguchi et al. | 428/692.1 |
| 2008/0029476 A1 * | 2/2008 | Ohmi et al. | 216/13 |
| 2008/0049410 A1 * | 2/2008 | Kawaguchi et al. | 361/818 |

FOREIGN PATENT DOCUMENTS

| | | |
|---|---|---|
| EP | 1 143 774 | 10/2001 |
| EP | 1 161 123 | 12/2001 |
| JP | 8-309918 | 11/1996 |
| JP | 9-93034 | 4/1997 |
| JP | 09-181476 | 7/1997 |
| JP | 2738590 | 1/1998 |
| JP | 10-190237 | 7/1998 |
| JP | 2867985 | 12/1998 |
| JP | 11-097810 | 4/1999 |
| JP | 2000-101204 | 4/2000 |
| JP | 2001-68801 | 3/2001 |
| JP | 2002-151916 | 5/2002 |
| JP | 2003-283073 | 10/2003 |
| JP | 2004-119961 | 4/2004 |
| JP | 2005-76091 | 3/2005 |
| JP | 2005-317880 | 11/2005 |
| JP | 2005-322792 | 11/2005 |
| JP | 2006-66810 | 3/2006 |
| JP | 2006-68986 | 3/2006 |
| JP | 2006-093414 | 4/2006 |
| JP | 2006-140430 | 6/2006 |
| KR | 2001-0107703 | 12/2001 |
| WO | WO 2005/099328 | 10/2005 |

OTHER PUBLICATIONS

Japanese Office Action, dated Apr. 12, 2011, issued in corresponding Japanese Application No. 2006-199286, and English Translation. Total 4 pages.

Japanese Office Action, dated Jun. 7, 2011, issued in corresponding Japanese Application No. 2006-181179, and English Translation. Total 6 pages.

Supplementary European Search Report with Communication mailed Dec. 7, 2009 in corresponding European patent application EP 07 76 7924, 13 pages.

European Search Report dated Mar. 23, 2011.

"Electromagnetic Noise Suppression for Electronics Cards and Boards", *IBM Technical Disclosure Bulletin International Business Machines Corp.,* 33(7):243-246 (1990).

* cited by examiner

4nm

NOISE-SUPPRESSING WIRING-MEMBER AND PRINTED WIRING BOARD

BACKGROUND OF THE INVENTION

1. Field of the Invention

The present invention relates to a noise-suppressing wiring-member for composing a printed wiring board and the printed wiring board. Also, the present invention relates to a noise suppressing structure and a multilayer printed wiring board.

The present invention claims priority on Japanese Patent Application No. 2006-181179, filed on Jun. 30, 2006, and Japanese Patent Application No. 2006-199286, filed on Jul. 21, 2006, the content of which is incorporated herein by reference.

2. Description of the Related Art

In recent years, a central processing unit (CPU) with a high clock frequency in a sub-microwave band (0.3 to 10 GHz), such as in a personal computer, personal digital electronics, local area wireless networks, Bluetooth, optical modules, mobile phones, game equipment, personal digital assistants, intelligent transport information systems, and the like, electronic equipment which utilizes a high-frequency bus, and an information communication device which utilizes an electric wave have been in wide-spread use in accordance with the spread of the use of the internet, and a ubiquitous society, in which a micro processing unit (MPU) will be required to have high-speed performance, multi-functions, integrated functions, and high-speed digitization performance, and in which devices will be required to offer high performance even when driven at a low-voltage, is on the horizon.

However, such a spread of these devices is becoming a controversial issue in that a radiation noise radiated from these devices and a conduction noise conducting through these devices cause malfunction of the devices, other electronic equipment, or parts thereof, and cause influences on the human body. As the noise, noise caused by impedance mismatching of conductors provided in a printed wiring board equipped with MPUs, electronic elements, and the like, noise caused by crosstalk between conductors, and noise induced by resonance between a power supply layer and a ground layer, the resonance being caused by simultaneously switching of semiconductor elements of the MPU or the like are exemplified. For example, when plural transistors in a semiconductor element mounted in a multilayer printed wiring board are simultaneously driven, unwanted high-frequency current flows in a power supply layer or a ground layer, as a result of which a potential variation occurs. The potential variation causes simultaneous switching noise in the power supply layer and the ground layer. Also, since the power supply layer and the ground layer have a parallel flat plate structure in which peripheral end parts thereof are opened, the potential variation causes resonance between the power supply layer and the ground layer, as a result of which radiation noise is radiated from the peripheral end parts.

As printed wiring boards in which occurrence of such noises are suppressed, the following printed wiring boards are known:

(1) a printed wiring board in which a metallic film made of a metal with a specific resistance greater than that of copper foil is formed on both surfaces of a power supply layer and a ground layer, the power supply layer and ground layer being formed by copper foil (Patent Document 1 (Japanese Unexamined Patent Application, First Publication No. H11-97810)); and (2) a printed wiring board in which a film containing a conductive substance, the film having an anisotropical conductivity in the vertical direction with respect to the printed wiring board surface, is formed on both surfaces of a power supply layer and a ground layer, the power supply layer and ground layer being formed by copper foils (Patent Document 2 (Japanese Laid-Open Patent Application No. 2006-66810)).

The printed wiring board (1) is considered that a high-frequency eddy current flowing on the surface of the copper foil can be attenuated therein, as a result of which an electric potential of power supply or the like can be stabilized and the radiation of unwanted noises can be suppressed even if semiconductor elements are simultaneously switched. In order to attenuate the high-frequency current (surface current) flowing on the surface of a conductor using a metallic film with a thickness of several micro meters, the thickness being approximately equal to the surface depth, a material with a considerably high specific resistance is required depending on the frequency of the high-frequency current to be attenuated. However, it is practically impossible to acquire such a material, and thereby the printed wiring board (1) cannot exhibit sufficient noise suppressing effects.

Also, the printed wiring board (2) is considered that the high-frequency eddy current can be attenuated therein in a similar way to the above. However, a step of forming an anisotropically conductive film with a surface roughness of copper foil equal to or greater than the surface depth is complicated The printed wiring board (2) also cannot exhibit sufficient noise suppressing effects.

As a method for suppressing radiation noise, (i) a method in which an electromagnetic shielding material which reflects an electromagnetic wave is used; and (ii) a method in which an electromagnetic wave absorption material which absorbs an electromagnetic wave propagating in space is used, are exemplified. As a method for suppressing generation of a conduction noise and a radiation noise, (iii) a method in which a high-frequency current flowing in conductors is suppressed before generating a conduction noise or a radiation noise is exemplified.

However, in the method (i), although shielding effects of the radiation noise can be exhibited, the radiation noise returns to oneself by unwanted radiation or reflection or the radiation noise by the shielding material. In the case of the method (ii), since the electromagnetic wave absorption material (such as, for example, one disclosed in Patent Document 3 (Japanese Unexamined Patent Application, First Publication No. H9-93034 and one disclosed in Patent 4 (Japanese Unexamined Patent Application, First Publication No. H9-181476) is heavy, thick, and fragile, it is not suitable for a device required to be small and light. Also, the conduction noise cannot be suppressed by the methods (i) and (ii). Accordingly, the method (iii) has attracted attention.

Also, Patent Document 1 discloses that a metallic film with a high resistance is formed on each copper foil layer composing a power supply layer or a ground layer. The metallic film with a high resistance is a monolayer film or an alloy film formed by plating nickel, cobalt, tin, tungsten, and the like, which has a specific resistance higher than that of copper. The metallic film with a high resistance is considered to be able to stabilize the potential variation of a power supply layer and a ground layer and suppress unwanted electromagnetic waves (radiation noise) radiated outward by eliminating the high-frequency current, even if semiconductor elements are switched.

However, since a metal with favorable workability, such as a nickel or the like, has a small resistance, sufficient effects cannot be exhibited. In contrast, since a metal with a high resistance, such as a tungsten or the like, is very difficult to process, and therefore cannot be used for parts, such as an area surrounding a semiconductor element, in which a complicated and fine pattern is required to be formed, the metal is not practically used. Also, the suppression of radiation noise is insufficient.

Patent Document 5 (Japanese Patent Publication No. 2867985) discloses a multilayer printed wiring board in which a resistive element such as carbon, graphite, or the like, is provided between a power supply layer and a ground layer at a peripheral end part of a multilayer printed wiring board.

However, when the resistive element is provided at only the peripheral end part, only the resonance frequency is changed by varying the impedance at the peripheral end part. The electric field intensity and the magnetic field intensity at other portions of the multilayer printed wiring board are enhanced. Accordingly, the radiation noise or the like, caused by resonance, cannot be suppressed still, and further countermeasures are required.

Patent Document 6 (Japanese Patent Publication No. 2738590) discloses a capacitive printed wiring board equipped with a capacitor laminate in which a dielectric sheet is held between two conductive foil layer, the conductive foil layers being electronically connected to each device.

However, the capacitive printed wiring board is required to be thick because the capacitor laminate has a certain thickness, and therefore it is not suitable for high density mounting. When the capacitive printed wiring board is thick, the resonance easily occurs between conductors with a parallel flat plate structure, and thereby the generation of the radiation noise cannot be sufficiently suppressed.

SUMMARY OF THE INVENTION

A first aspect of the present invention relates to a wiring member containing: a copper foil layer having a smooth surface with a surface roughness Rz of 2 μm or less; a noise suppressing layer containing a metallic material or a conductive ceramic and having a thickness of 5 to 200 nm; and an insulating resin layer provided between the smooth surface of the copper foil layer and the noise suppressing layer.

It is preferable that the noise suppressing layer have a portion in which the metallic material or the conductive ceramic is absent.

It is preferable that the wiring member further contain an adhesion promoting layer provided between the smooth surface of the copper foil layer and the insulating resin layer.

It is preferable that the wiring member further contain an adhesion promoting layer provided on a surface of the noise suppressing layer, the surface being on the side opposite to a side facing the copper foil layer.

It is preferable that the insulating resin layer have a thickness of 0.1 to 10 μm.

A second aspect of the present invention relates to a printed wiring board containing the wiring member of the first aspect.

It is preferable that the printed wiring board contain a power supply layer composed of the copper foil layer, the noise suppressing layer, and a ground layer, the noise suppressing layer being provided between the power supply layer and the ground layer.

A third aspect of the present invention relates to a noise suppressing structure containing: a first conductive layer; a second conductive layer; a noise suppressing layer provided between the first conductive layer and the second conductive layer, the noise suppressing layer being to be electromagnetically-coupled with the first conductive layer, the noise suppressing layer comprising a metallic material or a conductive ceramic, and the noise suppressing layer having a thickness of 5 to 300 nm; a first insulating layer provided between the first conductive layer and the noise suppressing layer; and a second insulating layer provided between the second conductive layer and the noise suppressing layer; wherein the noise suppressing structure has: a region (I) in which the noise suppressing layer and the first conductive layer face each other; and a region (II) in which the noise suppressing layer and the first conductive layer do not face each other but the noise suppressing layer and the second conductive layer face each other, the regions (I) and (II) neighboring each other.

It is preferable that the noise suppressing layer have an area substantially equal to that of the second conductive layer.

In the noise suppressing structure, it is preferable that the region (I) be provided at periphery end portions of the first conductive layer, and a region (III) in which the first conductive layer exists without facing the noise suppressing layer be further provided.

The first conductive layer may be divided into plural parts.

It is preferable that the first insulating layer have a thickness of 0.05 to 25 μm.

It is preferable that the first insulating layer have a relative dielectric constant of 2 or more.

It is preferable that the noise suppressing layer have a portion in which the metallic material or the conductive ceramic is absent.

It is preferable that the region (I) have an average width of 0.1 mm or more, the average width being calculated in accordance with the following formula (1):

the average width (mm) of the region (I)=an area (mm$^2$) of the region (I)/a length (mm) of a boundary line between the region (I) and the region (II) (1).

It is preferable that the region (II) have an average width of 1 to 50 mm, the average width being calculated in accordance with the following formula (2):

the average width (mm) of the region (II)=an area (mm$^2$) of the region (II)/a length (mm) of a boundary line between the region (I) and the region (II) (2).

A fourth aspect of the present invention relates to a multilayer printed wiring board containing the noise suppressing structure of the third aspect.

In the multilayer printed wiring board, it is preferable that one of the first conductive layer and the second conductive layer be made a power supply layer, and the other be made a ground layer.

It is preferable that the multilayer printed wiring board further contain a signal transmission layer, wherein either the power supply layer or the ground layer exist between the signal transmission layer and the noise suppressing layer.

It is preferable that the noise suppressing structure serve as a capacitive laminated product.

DETAILED DESCRIPTION OF THE INVENTION

An object of the present invention is to provide a wiring member for a printed wiring board, which can stabilize an electric potential of a power supply and suppress radiation of unwanted noise by suppressing resonance between a power supply layer and a ground layer caused by simultaneous switching, and also provide a printed wiring board equipped with the wiring member. Moreover, another object of the present invention is to provide a noise suppressing structure which can suppress generation of the conduction noise and radiation noise and can be thinned, and also to provide a multilayer printed wiring board.

<Wiring Member>

Figure 1:
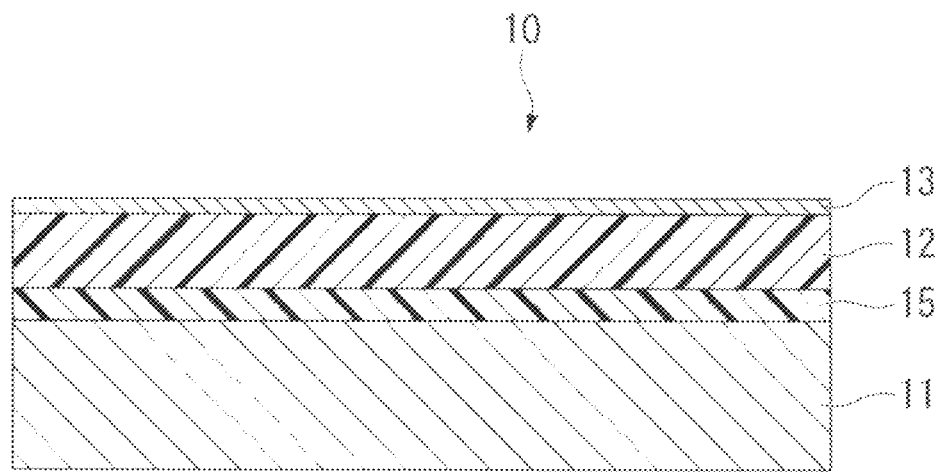
FIG. 1 is a schematic cross-sectional view showing one aspect of a wiring member according to the present invention.

FIG. 1 is a schematic cross-sectional view showing one aspect of the wiring member according to the present invention. The wiring member 10 has a copper foil layer 11, an insulating resin layer 12 formed on the copper foil layer 11, and a noise suppressing layer 13 formed on the surface of the insulating resin layer 12.

(Copper Foil Layer)

As the copper foil layer 11, electrolytic copper foil, rolled copper foil, or the like may be used.

The surface of copper foil is generally treated to be roughened by adhering fine copper particles to the surface thereof for improving adherence to the insulating resin layer 12. In contrast, the copper foil layer 11 according to the present invention has a smooth surface with a surface roughness Rz of 2 μm or less at a face nearing the noise suppressing layer 13. When the smooth surface has a surface roughness Rz of 2 μm or less, sufficient noise suppressing effects can be exhibited by preventing the occurrence of defects such as pinholes caused by the surface-roughness of the copper foil layer 11 in the insulating resin layer 12 and preventing a short-circuit between the copper foil layer 11 and the noise suppressing layer 13, even if the insulating resin layer 12 is thinly formed. The surface roughness Rz means a ten point average roughness Rz determined in accordance with JIS B 0601-1994.

As the copper foil layer 11, electrolytic copper foil is particularly preferable. The electrolytic copper foil is obtained by precipitating copper on the surface of a cathode rotating drum using an electrolytic reaction, followed by separating the formed copper film from the rotating drum. One surface of the obtained film contacting the drum is a smooth surface in which the surface condition of the drum is transferred. The other surface on which the copper is electrolytic precipitated is a rough surface because the crystal growth rates of the copper precipitating in each crystal face are different from each other. Such a rough surface is favorable for adhering it to another insulating resin layer (which is not shown).

It is preferable that the thickness of the copper foil layer 11 be within the range of 3 to 50 μm.

(Insulating Resin Layer)

The insulating resin layer 12 is a layer composed of a resin composition or a layer composed of a fiber-reinforced resin in which a resin composition is immersed in reinforcing-fiber such as glass fiber or the like. The state of the fiber-reinforced resin may be at a B-stage (semi-cured state) or at a C-stage (cured state).

The resin composition is a composition mainly containing a resin. As the resin, one having a thermal resistance for enduring heat at a time of preparing a printed wiring board, the thermal resistance being required for the printed wiring board, or one of which characteristic values required for designing a printed wiring board, such as dielectric constant, dielectric loss tangent, or the like, are known, is preferably used. Examples of the resin include polyimide resin, epoxy resin, bismaleimide-triazine resin, polytetrafluoroethylene, polyphenylene ether, and the like.

As the resin composition, one containing an epoxy resin, and, as needed, a hardener, hardening accelerator, flexibility-imparting agent, or the like is preferable.

Examples of the epoxy resin include bisphenol A type epoxy resin, bisphenol F type epoxy resin, bisphenol S type epoxy resin, novolac type epoxy resin, cresol novolac type epoxy resin, alicyclic epoxy resin, bromine epoxy resin, glycidylamine type epoxy resin, and the like. The content of the epoxy resin is preferably within the range of 20 to 80% by mass with respect to 100% by mass of the resin composition.

Examples of the hardener include: dicyandiamides; imidazoles; amines such as aromatic amines; phenols such as bisphenol A, bromine bisphenol A, and the like; novolac resins such as phenol novolac resins, cresol novolac resins, and the like; acid anhydrides such as phthalic anhydride, and the like.

Examples of the hardening accelerator include tertiary amines, imidazole-based hardening accelerators, urea-based hardening accelerators, and the like.

Examples of the flexibility-imparting agent include polyether sulphone resins, aromatic polyamide resins, elastomeric resins, and the like.

Examples of the aromatic polyamide resins include ones synthesized by polycondensation of aromatic diamine and dicarboxylic acid. Examples of the aromatic diamine include 4,4'-diaminodiphenylmethane, 3,3'-diaminodiphenylsulphone, m-xylenediamine, 3,3'-oxydianiline, and the like. Examples of the dicarboxylic acid include phthalic acid, isophthalic acid, terephthalic acid, fumaric acid, and the like.

Examples of the elastomeric resin include natural rubber, styrene-butadiene rubber, butadiene rubber, butyl rubber, ethylene-propylene rubber, and the like. In order to ensure the thermal resistance of the insulating resin layer 12, a nitrile rubber, chloroprene rubber, silicone rubber, or urethane rubber may be used together. As the nitrile rubber, a carboxy-terminated butadiene nitrile rubber (CTBN) is preferable.

The insulating resin layer 12 is formed, for example, by applying a varnish in which a resin composition is dissolved or dispersed in a solvent on the copper foil layer 11 (or the adhesion promoting layer 15 described below) and then drying.

The varnish is applied and dried in two or more times, and the insulating resin layer may be formed in two or more layers. Each layer may be formed by a varnish identical to or different from each other.

It is preferable that the thickness of the insulating resin layer 12 be within the range of 0.1 to 10 µm. When the thickness of the insulating resin layer 12 is 0.1 µm or more, sufficient insulation between the copper foil layer 11 and the noise suppressing layer 13 can be maintained, and the short-circuit between the copper foil layer 11 and the noise suppressing layer 13 can be suppressed, as a result of which sufficient noise suppressing effects can be realized. Also, the noise suppressing layer 13 is not affected by etching the copper foil layer 11 for patterning. On the other hand, when the thickness of the insulating resin layer 12 is 10 µm or less, the printed wiring board equipped with the wiring member can be thinned. Also, the noise suppressing layer 13 gets closer to the copper foil layer 11, as a result of which the noise suppressing layer 13 is electromagnetically-coupled with the copper foil layer 11 tightly, and thereby sufficient noise suppressing effects can be exhibited. Also, the insulating resin layer 12 can be easily removed when patterning is performed on the noise suppressing layer 13 from the side near the copper foil layer 11, and thereby time required for processing is shortened.

(Noise Suppressing Layer)

The noise suppressing layer 13 is a thin film containing a metallic material or a conductive ceramic, and the thickness thereof is 5 to 300 nm.

When the thickness of the noise suppressing layer 13 is 5 nm or more, sufficient noise suppressing effects can be exhibited. On the other hand, when the thickness of the noise suppressing layer 13 is 300 nm or less, a microcluster as described below is not grown to form a uniform thin film composed of a metallic material or the like. When such a uniform thin film is formed, the surface resistance decreases, and the metal reflection increases, as a result of which the noise suppressing effects decrease.

The thickness of the noise suppressing layer 13 is determined by averaging values of the thickness of the noise suppressing layer measured at five points (dense portions) on an image taken by a high resolution transmission electron microscope (see, for example, FIG. 4) observing a cross-section in the thickness-direction of the noise suppressing layer.

The surface resistance of the noise suppressing layer 13 is preferably within the range of $1\times10^0$ to $1\times10^4$ Ω. When the noise suppressing layer 13 is a uniform thin film, a limited material with a high volume specific resistance is required. However, when the volume specific resistance of the material is not so high, the surface resistance can be enhanced, by forming a portion in which the metallic material or the conductive ceramic is absent in the noise suppressing layer 13 to provide a physical defect which results in formation of an uneven thin film, or by making a sequencing product of a microcluster described below. The surface resistance of the noise suppressing layer 13 is determined as described below.

The surface resistance is measured between two thin film metallic electrodes (with a length of 10 mm, a width of 5 mm, and an inter-electrode distance of 10 mm) with a measurement current of 1 mA or less while pressing a measuring product with the electrodes at a constant load of 50 g/cm$^2$, for example, the electrodes being placed with an interval of a unit length, and being formed by depositing gold or the like onto silica glass.

Examples of the metallic material include a ferromagnetic metal, a paramagnetic metal, and the like. Examples of the ferromagnetic metal include: iron, carbonyl iron; iron alloys such as Fe—Ni, Fe—Co, Fe—Cr, Fe—Si, Fe—Al, Fe—Cr—Si, Fe—Cr—Al, Fe—Al—Si, Fe—Pt, and the like; cobalt, nickel; alloys thereof, and the like. Examples of the paramagnetic metal include a gold, silver, copper, tin, lead, tungsten, silicon, aluminium, titanium, chromium, molybdenum, alloys thereof, amorphous alloys, alloys thereof with the ferromagnetic metal, and the like. Among these, nickel, iron chromium alloys, tungsten, and noble metals are preferable because they have a resistance to acidification. Because the noble metals are expensive, a nickel, nickel chromium alloys, iron chromium alloys, and tungsten are preferable in terms of practical use, and nickel and nickel alloys are particularly preferable.

Examples of the conductive ceramic include alloys, intermetallic compounds, solid solutions, and the like, composed of a metal and at least one element selected from the group consisting of boron, carbon, nitrogen, silicon, phosphorus, and sulfur. Specific examples thereof include nickel nitride, titanium nitride, tantalum nitride, chromium nitride, zirconium nitride, titanium carbide, zirconium carbide, chromium carbide, vanadium carbide, molybdenum carbide, tungsten carbide, silicon carbide, chromium boride, molybdenum boride, molybdenum silicide, zirconium silicide, and the like.

Since the conductive ceramic has a volume specific resistance greater than that of a metal, the noise suppressing layer containing the conductive ceramic does not extremely decrease the characteristic impedance. Accordingly, the metal reflection in the noise suppressing layer decreases. Also, the conductive ceramic does not have a particular resonance frequency, the range of the frequency realizing the noise suppressing effects is wide. Also, some advantages such as high chemical stability and storage stability can be realized. As the conductive ceramic, nitrides or carbides, which are easily prepared using a reactive gas such as a nitrogen gas, methane gas, or the like, in accordance with a physical deposition process described below, are particularly preferable.

As the method for forming the noise suppressing layer 13, a conventional wet plating process, a physical deposition process, a chemical deposition process, or the like can be used. By these processes, although depending on conditions or materials used, an uneven thin film with a fine physical defect can be formed without forming any even thin film by ending the growth of the thin film at an early stage. Also, the uneven thin film can be formed by a process in which a defect is provided on an even thin film by performing etching with an acid or the like, or by performing laser ablation.

Figure 2:
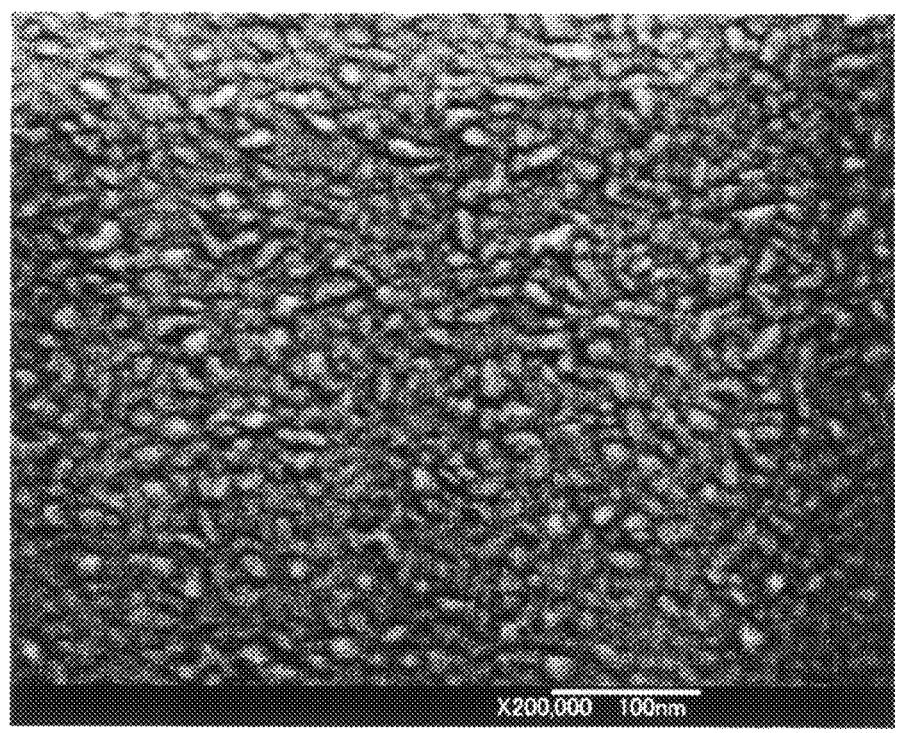
FIG. 2 is an image displayed on a field emission type scanning electron microscope observing the surface of a noise suppressing layer.
Figure 3:
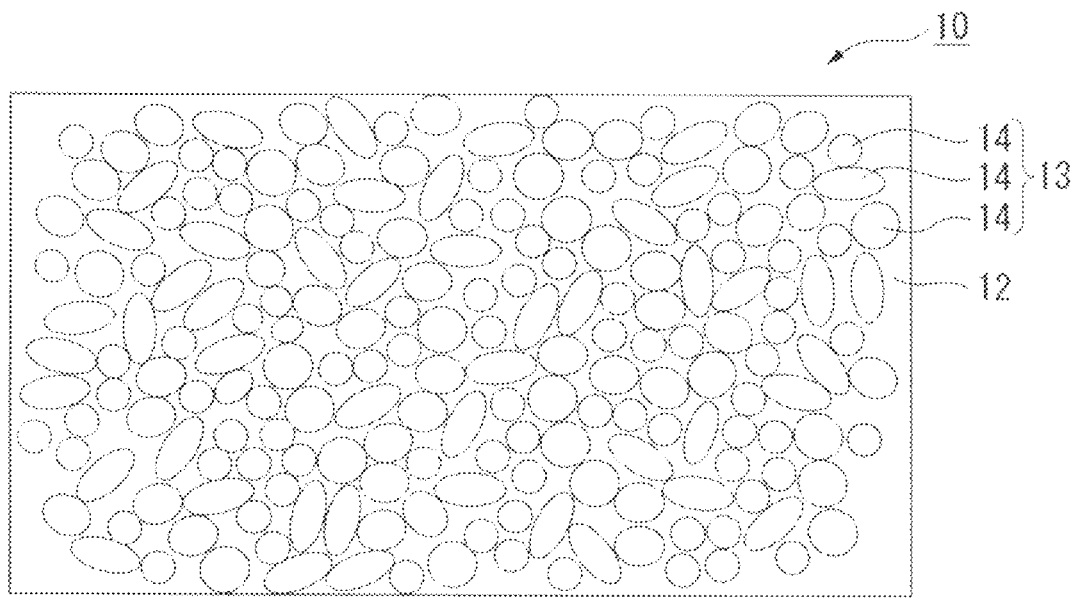
FIG. 3 is a schema of FIG. 2.

FIG. 2 shows an image taken by a field emission type scanning electron microscope observing the surface of the noise suppressing layer formed by physically depositing the metallic material on the surface of the insulating resin layer, and FIG. 3 is a schema thereof. The noise suppressing layer 13 is observed as an aggregation of plural microclusters 14. The microclusters 14 are formed by extremely thinly and physically depositing the metallic material on the (first) insulating resin layer 12 (or the second insulating layer 12'). Between the microclusters 14, there are physical defects, and no even thin film is formed. Although the microclusters 14 contact with each other to agglomerate, there are many defects, that is, portions in which no metallic material is present between the agglomerated microclusters 14.

Figure 4:
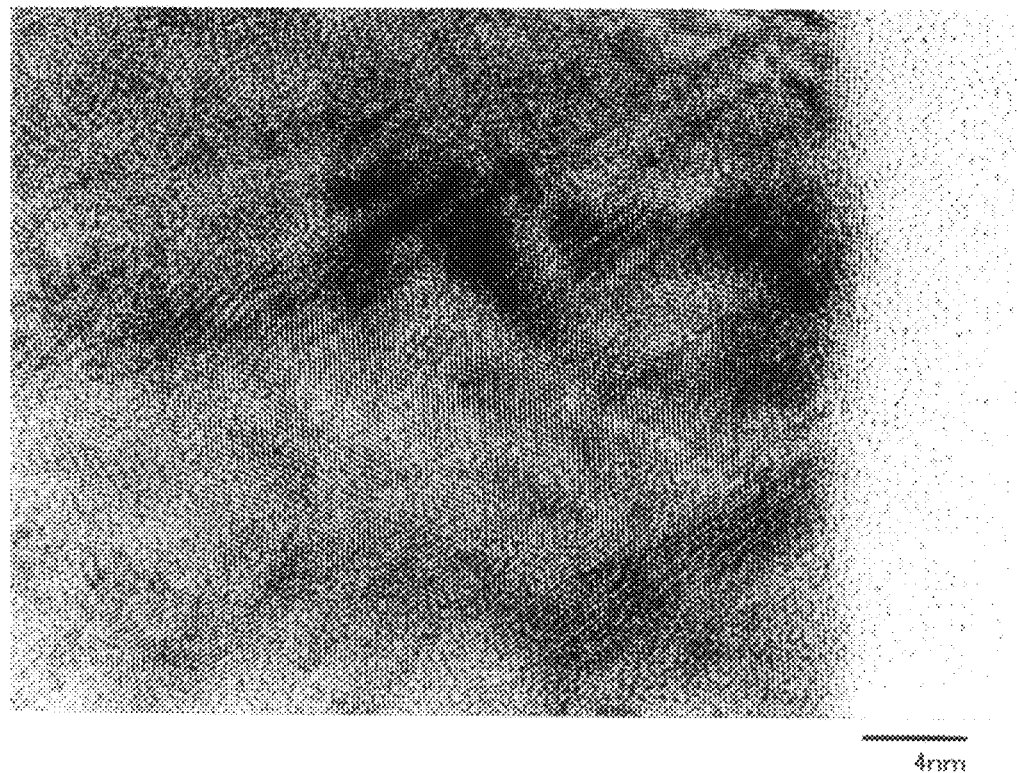
FIG. 4 is an image displayed on a high resolution transmission electron microscope observing a cross section of the noise suppressing layer shown in FIG. 2.

FIG. 4 shows an image taken by a high resolution transmission electron microscope observing a cross-section of the noise suppressing layer 13 in the thickness-direction. In FIGS. 2 and 4, there are crystal lattices (microclusters) in which metallic atoms are arranged as extremely fine crystals with a several Å intervals, and portions in which any metallic materials are absent in an extremely small area. That is, there are vacant spaces between the microclusters and an even thin film composed of the metallic material is not formed. The state with such a defect can be recognized by checking the relationship between the volume specific resistance $R_1$ ($\Omega \cdot cm$) calculated from the actual measurement value of the surface resistance of the noise suppressing layer 13 and the volume specific resistance $R_0$ ($\Omega \cdot cm$) (value disclosed in literature) of the metallic material (or conductive ceramic). That is, excellent noise suppressing effects can be exhibited when the volume specific resistance $R_1$ and the volume specific resistance $R_0$ satisfy the following formula:

$$0.5 \leq \log R_1 - \log R_0 \leq 3.$$

The noise suppressing layer 13 may be patterned to a predetermined shape, and be provided with an anti-pad such as a through hole. The noise suppressing layer 13 may be processed to a predetermined shape by a conventional etching process, laser ablation process, or the like.

(Adhesion Promoting Layer)

In order to enhance the adhesiveness between the copper foil layer 11 and the insulating resin layer 12, it is preferable that an adhesion promoting layer 15 be formed on the smooth surface of the copper foil layer 11.

The adhesion promoting layer 15 may be formed by treating the smooth surface of the copper foil layer 11 with an adhesion promote. Examples of the adhesion promoter include silane coupling agents, titanate coupling agents, and the like.

Examples of the silane coupling agents include vinyl triethoxy silane, vinyl tris(2-methoxyethoxy)silane, 3-methacryloxy propyl trimethoxy silane, 3-glycidoxy propyl trimethoxy silane, 2-(3,4-epoxy cyclohexyl)ethyl trimethoxy silane, N-2-(aminoethyl)3-amino propyl trimethoxy silane, N-2-(aminoethyl)3-aminopropyl methyl dimethoxy silane, 3-aminopropyl triethoxy silane, N-phenyl-3-aminopropyl trimethoxy silane, 3-mercaptopropyl trimethoxy silane, 3-chloropropyl trimethoxy silane, and the like.

Examples of the titanate coupling agents include isopropyl triisostearoyl titanate, isopropyl tris(dioctyl pyrophosphate) titanate, isopropyl tri(N-aminoethyl-aminoethyl)titanate, tetraoctylbis(di-tridecyl phosphate)titanate, bis(dioctyl pyrophosphate)oxyacetate titanate, bis(dioctyl pyrophosphate) ethylene titanate, isopropyl trioctanoyl titanate, isopropyl dimethacryl isostearoyl titanate, isopropyl isostearoyl diacryl titanate, tetraisopropyl bis(dioctyl phosphate)titanate, and the like.

As the adhesion promoter, 3-glycidoxypropyltrimethoxysilane is generally used. In order to enhance the peeling strength between the copper foil layer 11 and the insulating resin layer 12 to 1.0 kgf/cm or more, 3-mercaptopropyltrimethoxysilane is preferably used.

As a method for forming the adhesion promoting layer 15, an applying method, an immersing method, a showering method, a spraying method, or the like, may be used.

Also, another adhesion promoting layer (which is not shown in the drawings) may be formed on the noise suppressing layer 13 so as to enhance the adhesiveness of the noise suppressing layer 13 to another insulating resin layer (which is also not shown in drawings).

The adhesion promoting layer may be formed by a method in which the above-mentioned silane coupling agent or titanate coupling agent is applied, or a method in which an epoxy resin or the like, in which the coupling agent is integrally blended, is applied. The adhesion promoting layer may be formed after patterning the noise suppressing layer 13.

<Printed Wiring Board>

A printed wiring board according to the present invention contains the wiring member according to the present invention. In the printed wiring board, the copper foil serves as a signal transmission layer, power supply layer, or ground layer. In order to realize sufficient noise suppressing effects, the copper foil of the wiring member preferably serves as the power supply layer or the ground layer, and more preferably serves as the power supply layer. Also, in order to realize sufficient noise suppressing effects, the noise suppressing layer is preferably formed between the power supply layer and the ground layer.

Figure 5:
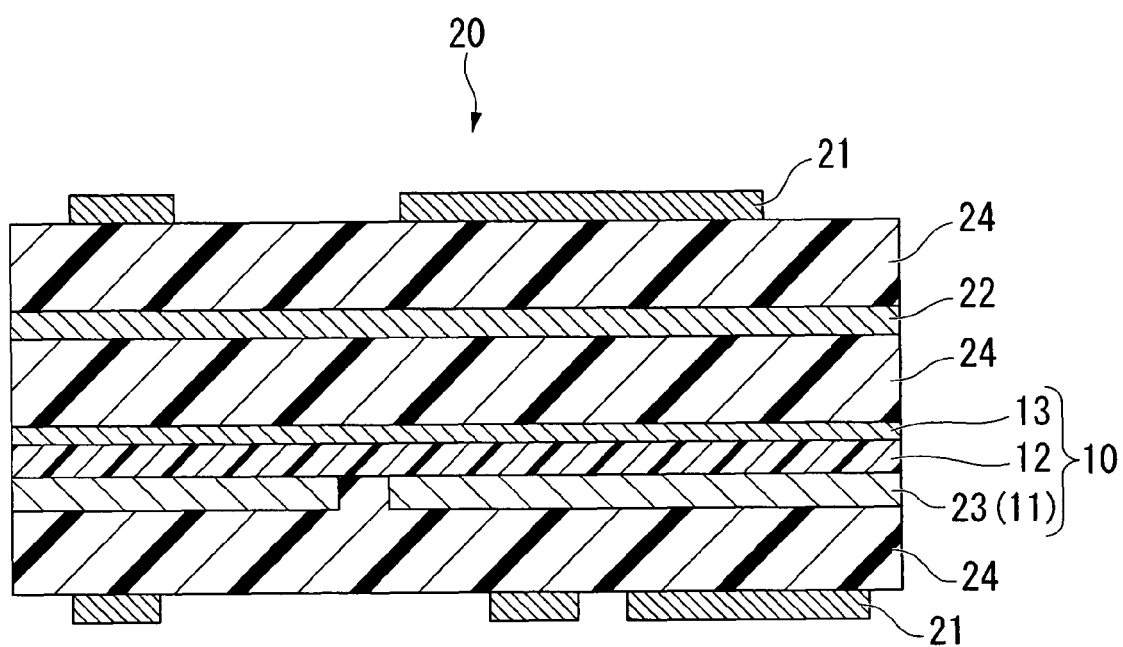
FIG. 5 is a schematic cross-sectional view showing one aspect of a printed wiring board according to the present invention.

FIG. 5 is a schematic cross-sectional view illustrating one aspect of the printed wiring board according to the present invention. In the printed wiring board 20, a signal transmission layer 21 which is patterned, a ground layer 22 which covers almost the entire surface of the printed wiring board 20, a power supply layer 23, another signal transmission layer 21 which is also patterned are laminated in this order from the top via insulating layers 24.

The power supply layer 23 is the copper foil layer 11 of the wiring member 10. On the ground layer 22 side surface of the power supply layer 23, a noise suppressing layer 13 with almost the same size as that of the ground layer 22 is formed via the insulating resin layer 12. The power supply layer 23 is divided into two parts, and the divided parts are insulated from each other.

For example, the printed wiring board 20 is manufactured as described below.

A prepreg prepared by immersing an epoxy resin or the like into a glass fiber or the like is hardened while holding it between the wiring member 10 and another copper foil layer to construct the copper foil layer 11 of the wiring member 10 as the power supply layer 23, the another copper foil layer as the ground layer 22, and a layer formed by the prepreg as the insulating layer 24.

Then, the copper foil layer 11 of the wiring member 10 is etched to provide a predetermined shape (two-division pattern) by a photolithography method. At that time, the noise suppressing layer 13 is not injured by etching, because the insulating resin layer 12 exhibits resistance to an etching solution, and the insulating resin layer 12 does not have any pinholes or the like. Copper foil is adhered to both outermost surfaces of the power supply layer 23 and the ground layer 22, both being cores, using the prepreg to form signal transmission layers 21.

Since the wiring member according to the present invention as described above includes the copper foil layer with a smooth surface having a surface roughness Rz of 2 µm or less, the noise suppressing layer containing a metal or a conductive ceramic with a thickness of 5 to 200 nm, and the insulating resin layer formed between the smooth surface of the copper foil layer and the noise suppressing layer, sufficient insulation can be realized between the copper foil layer and the noise suppressing layer.

Since the printed wiring board according to the present invention as described above has the wiring member according to the present invention, the noise suppressing layer attenuates the high-frequency current directed into the power supply layer by simultaneous switching, and suppresses the generation of resonance between the power supply layer and the ground layer. As a result, the radiation of the noise from peripheral end parts of the board can be suppressed.

<Noise Suppressing Structure>

Figure 6:
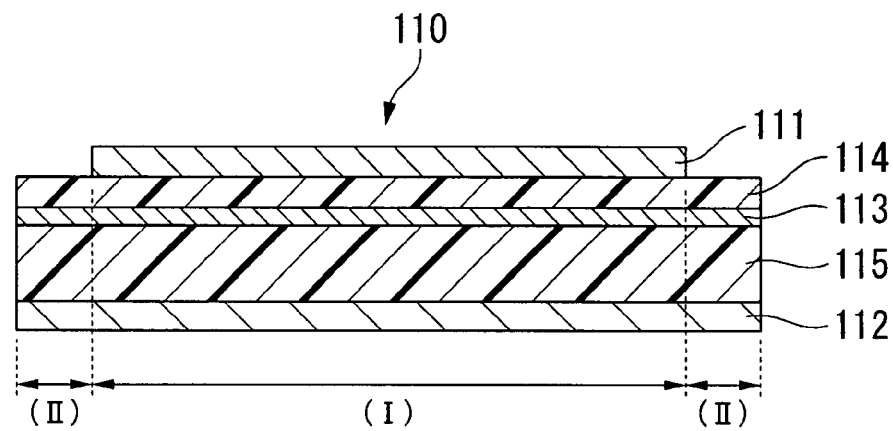
FIG. 6 is a cross-sectional view showing one aspect of a noise suppressing structure according to the present invention.
Figure 7:
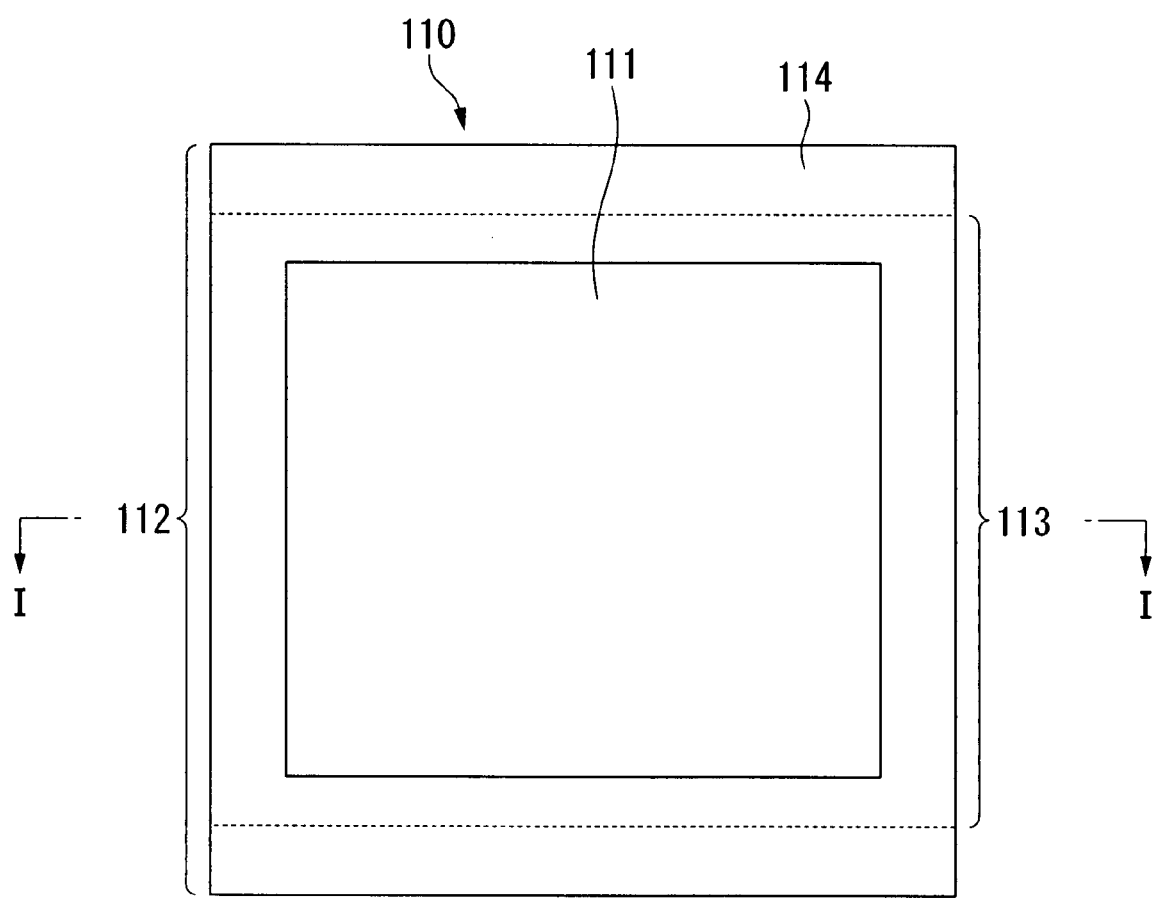
FIG. 7 is a top view of the noise suppressing structure shown in FIG. 6.

FIG. 6 is a cross-sectional view illustrating one aspect of the noise suppressing structure according to the present invention, and FIG. 7 is a top view thereof. The noise suppressing structure 110 has a first conductive layer 111, a second conductive layer 112, a noise suppressing layer 113 formed between the first conductive layer 111 and the second conductive layer 112, a first insulating layer 114 formed between the first conductive layer 111 and the noise suppressing layer 113, and a second insulating layer 115 formed between the second conductive layer 112 and the noise suppressing layer 113.

In the noise suppressing structure 110, the noise suppressing layer 113 is electromagnetically-coupled with the first conductive layer 111. The term "electromagnetically-coupled" means a state caused by a current flowing into the first conductive layer 111, in which the current generates a magnetic flux which intersects with the noise suppressing layer 113, and thereby a voltage is induced. According to the present invention, the noise suppressing layer 113 is required to be electromagnetically-coupled with the first conductive layer 111 via the first insulating layer 114 without electrically connecting to the first conductive layer 111. In the noise suppressing structure 110, it is preferable that the noise suppressing layer 113 be electromagnetically-coupled with the second conductive layer 112.

The noise suppressing structure 110 includes a region (I) in which the noise suppressing layer 113 and the first conductive layer 111 face each other, and a region (II) in which the noise suppressing layer 113 and the first conductive layer 111 do not face each other, but the noise suppressing layer 113 and the second conductive layer 112 face each other, the region (I) and the region (II) neighboring each other.

Since the noise suppressing structure 110 has the regions (I) and (II) neighboring each other, noise suppressing effects can be realized. The reason for this is assumed as follows.

The noise suppressing layer 113 has fine conductive paths such as microclusters as described below. The conductive paths have plural fine and complicated open stub structures provided on the second conductive layer 112 in the region (II). The open stub structures serve as a transmission-line filter by electromagnetically-coupling to the first conductive layer 111 in the neighboring region (I).

Accordingly, in the region (II), it is required that the noise suppressing layer 113 and the first conductive layer 111 do not face each other, but the noise suppressing layer 113 and the second conductive layer 112 face each other. Also, in the region (I), it is required that the noise suppressing layer 113 and the first conductive layer 111 face each other, and the noise suppressing layer 113 electromagnetically-couples with the first conductive layer 111.

In the region (I), it is preferable that the average width of the region (I) calculated in accordance with the following formula (1) be 0.1 mm or more so that the noise suppressing layer 113 is sufficiently electromagnetically-coupled with the first conductive layer 111.

The average width of the region (I) (mm) is equal to the area of the region (I) (mm$^2$) divided by the length of the boundary line between the region (I) and the region (II) (mm). (1)

The upper limit of the average width of the region (I) depends on the size of the first conductive layer 111, and is an arbitrary value.

Figure 8:
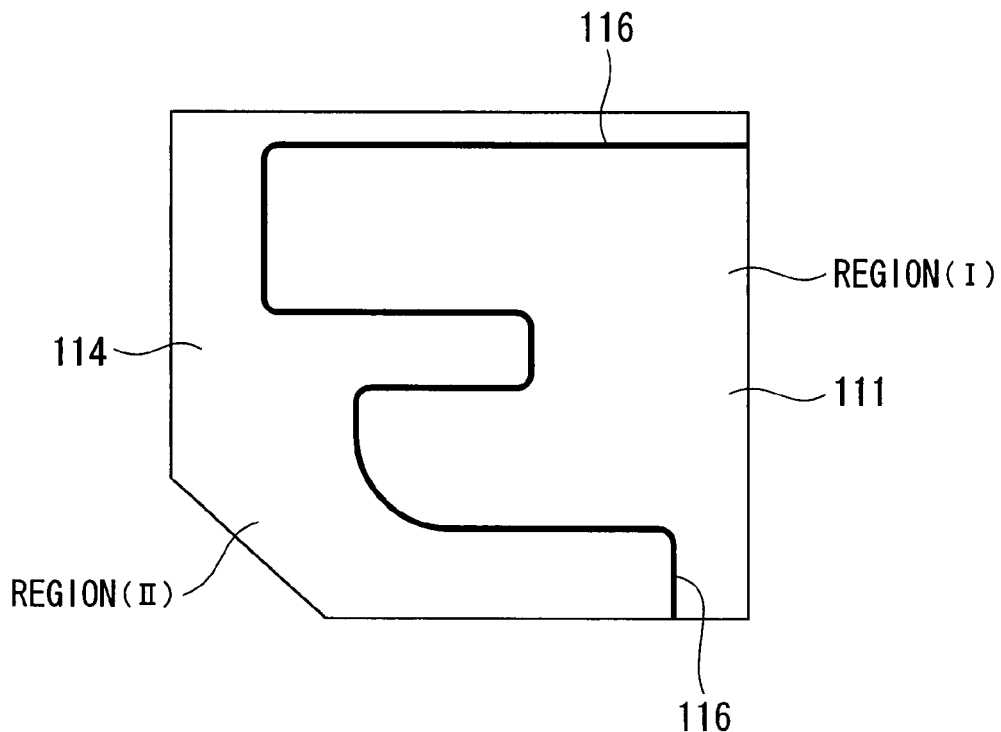
FIG. 8 is a top view of a noise suppressing structure, which shows a boundary line between a region (I) and a region (II).

When the noise suppressing layer 113 and the second conductive layer 112 exist on the whole area of the noise suppressing structure 110, the length of the boundary line between the region (I) and the region (II) is a length of the boundary line (thick line shown in FIG. 8 as the reference number of 116) between the region (I) in which the first conductive layer 111 exists and the region (II) in which the first conductive layer 111 does not exist and therefore the first insulating layer 114 appears on the surface thereof.

Moreover, it is preferable that the average width of the region (II) calculated in accordance with the following formula (2) be within the range of 1 to 50 mm.

The average width of the region (II) (mm) is equal to the area of the region (II) (mm$^2$) divided by the length of the boundary line between the region (I) and the region (II) (mm). (2)

When the average width of the region (II) is 1 mm or more, sufficient noise suppressing effects can be realized. Also, the noise suppressing effects can be realized in a low frequency region of 100 MHz or less. When the average width of the region (II) exceeds 50 nm, the area of the region (II) increases with respect to realized noise suppressing effects, and thereby the size of the noise suppressing structure 110 is unnecessarily enlarged, which may affect high density mounting. Also, there is a possibility in which the impedance of the first conductive layer 111 may be enhanced.

Also, when only one of the noise suppressing layer 113 and the second conductive layer 112 is large, there is a tendency in which the area of the region (II) is not sufficient, and thereby the noise suppressing effects are small. In order to ensure sufficient area of the region (II), it is preferable that both of the noise suppressing layer 113 and the second conductive layer 112 have their largest size in the noise suppressing structure 110. In order to ensure sufficient area of the region (II), it is preferable that the area of the noise suppressing layer 113 be substantially the same as that of the second conductive layer 112 (approximately 80 to 100% of the area of the second conductive layer 112).

Figure 9:
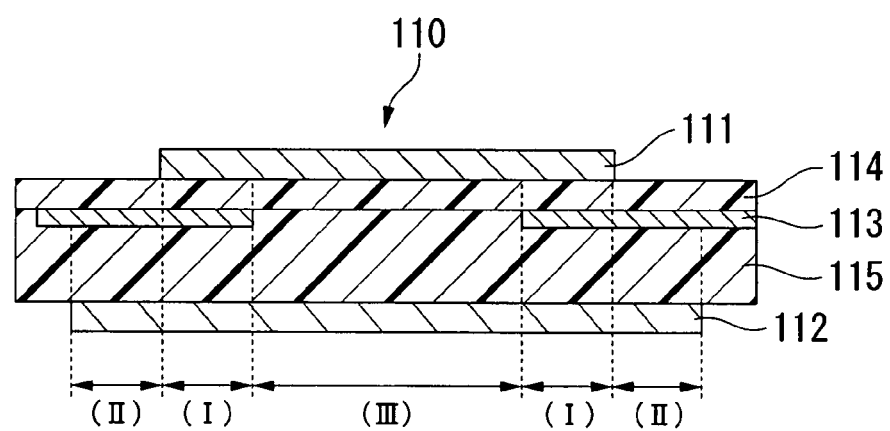
FIG. 9 is a cross-sectional view showing another aspect of the noise suppressing structure according to the present invention.

FIG. 9 shows one aspect of the noise suppressing structure 110 having a region (I) in which periphery end portions of the first conductive layer 111 exist and a region (III) in which the first conductive layer 111 exists but the first conductive layer 111 does not face the noise suppressing layer 113. Since the high-frequency current flowing into the first conductive layer 111 concentrates on the periphery end portions by edge effects, the noise suppressing layer 113 can be effectively electromagnetically-coupled with the first conductive layer 111 at the periphery end portions thereof. Also, existence of the region (III) makes it easy to form a through hole or via hole insulated from the noise suppressing layer 113. The area of the region (I), that is, the noise suppressing effect is not effected by forming the through hole or the via hole.

Figure 10:
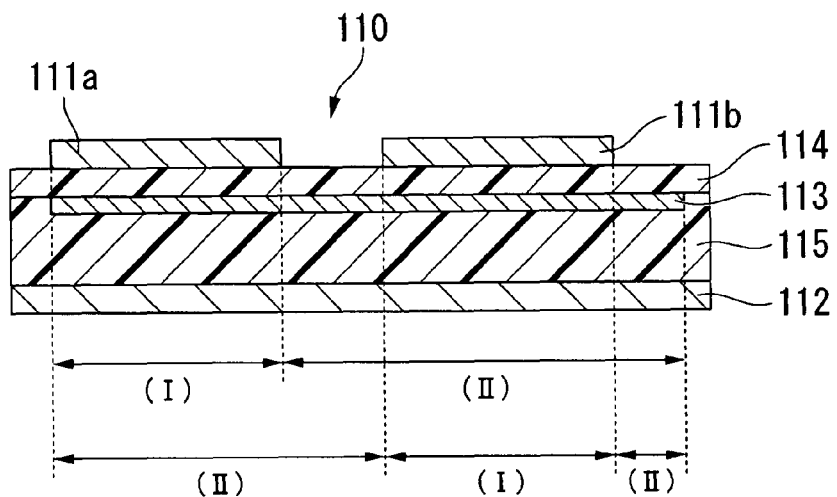
FIG. 10 is a cross-sectional view showing another aspect of the noise suppressing structure according to the present invention.

FIG. 10 shows one aspect of the noise suppressing structure 110 in which the first conductive layer 111 is divided into two parts, that is, the first conductive layer 111a and the first conductive layer 111b. When the first conductive layer 111 is divided in such a way, even if the region (II) is narrow, an area of the first conductive layer 111b is deemed as the region (II) from the standpoint of the first conductive layer 111a. Accordingly, sufficient noise suppressing effects can be realized even if the region (II) has a limitation. In a similar manner, an area of the first conductive layer 111a is deemed as the region (II) from the standpoint of the first conductive layer 111b. The first conductive layer 111 is divided in consideration of the difference between a digital circuit and an analog circuit, difference in the frequency, voltage, function, or the like.

(Conductive Layer)

As each conductive layer, a metallic foil; a film of conductive particle dispersion in which metal particles are dispersed in a polymeric binder, glass binder, or the like; or the like, can be exemplified. Examples of the metal include copper, silver, gold, aluminium, nickel, tungsten, and the like.

Each conductive layer serves in a multilayer printed circuit board as a signal transmission layer, power supply layer, or ground layer, and is generally a copper foil layer. The thickness of the copper foil layer is generally within the range of 3 to 35 µm. The copper foil layer may be subjected to a roughening treatment for improving the adhesiveness to the insulating layer or a chemical conversion treatment using a silane coupling agent or the like.

(Noise Suppressing Layer)

The noise suppressing layer of the noise suppressing structure is substantially equal to the noise suppressing layer of the wiring member described above with reference to FIGS. 2 to 4.

(Insulating Layer)

The insulating layer is a layer composed of a dielectric material having a surface resistance of $1 \times 10^6$ Ω or more.

A material forming the insulating layer may be an inorganic material or organic material, provided that the material is a dielectric material.

Examples of the inorganic material include ceramics such as aluminium oxide, aluminium nitride, silicon oxide, silicon nitride, and the like, foamed ceramics, and the like. Although microclusters easily aggregate to form an even thin film when the insulating layer is formed by a hard material such as a ceramic or the like, an uneven thin film with a defect can be formed by suppressing aggregation of the microclusters by forming a thin film in which the mass of a metallic material or the like is decreased.

Examples of the organic material include: resins such as polyolefin, polyamide, polyester, polyether, polyketone, polyimide, polyurethane, polysiloxane, polysilazane, phenol resin, epoxy resin, acryl resin, polyacrylate, vinyl chloride resin, chlorinated polyethylene, and the like; diene rubbers such as natural rubber, isoprene rubber, butadiene rubber, styrene-butadiene rubber, and the like; non-diene rubbers such as butyl rubber, ethylene-propylene rubber, urethane rubber, silicone rubber, and the like. The organic material may be thermoplastic or thermosetting, and may be an unhardened material thereof. Also, the organic material may be a denatured material, mixture, or copolymer of the above-mentioned resins.

When the insulating layer is composed of an organic material, the insulating layer has a complicated surface structure in nano level due to the morphology of the organic polymer material. Accordingly, aggregation of the microclusters is suppressed and an uneven aggregation structure of the microclusters are easily held, as a result of which a noise suppressing layer which can realize great noise suppressing effects can be obtained.

As the insulating layer, a layer with a surface having a group containing an element that realizes covalent binding to a metal, such as oxygen, nitrogen, sulfur, or the like, and a layer with a surface activated by radiating ultraviolet rays, plasma, or the like, thereto, are preferable in view of the adhesiveness to the clusters, and the capability of stabilizing dispersion of microclusters by suppressing aggregation and growing of the microcluster. Examples of the group containing an element such as oxygen, nitrogen, sulfur, or the like, include hydrophilic groups such as a hydroxy group, carboxyl group, ester group, amino group, amide group, thiol group, sulfone group, carbonyl group, epoxy group, isocyanate group, alkoxy group, and the like.

It is preferable that the thickness of the first insulating layer 114 be thinner than that of the second insulating layer 115 so that the noise of the first conductive layer 111 is suppressed. The thickness of the first insulating layer 114 is preferably within the range of 0.05 to 25 µm. When the thickness of the first insulating layer 114 is 0.05 µm or more, the insulation between the noise suppressing layer 113 and the first conductive layer 111 is ensured and the noise suppressing effects are sufficiently exhibited. Also, the divided first conductive layer 111 (such as, for example, the first conductive layers 111a and 111b shown in FIG. 10) does not short-circuit. When the first conductive layer 111 is etched, the noise suppressing layer 113 is protected from an etching liquid or the like. When the thickness of the first insulating layer 114 is 25 µm or less, the noise suppressing layer 113 is sufficiently electromagnetically-coupled with the first conductive layer 111. Also, the noise suppressing structure 110 can be thinned.

The relative dielectric constant of the first insulating layer 114 is preferably 2 or more, and more preferably 2.5 or more. When the relative dielectric constant of the first insulating layer 114 is 2 or more, the dielectric constant of the first insulating layer 114 sufficiently increases to form electromagnetic bonding between the noise suppressing layer 113 and the first conductive layer 111. The maximum value of the relative dielectric constant of current usable materials is 100,000.

When a material with a high dielectric constant is used for the second insulating layer 115, the noise suppressing structure 110 can be considered a capacitive laminated product composed of the first conductive layer 111 and the second conductive layer 112. When the noise suppressing structure 110 has a function as a capacitive laminated product, the same effects as those obtained by using in combination a bypass condenser, of which effects are conventionally recognized, are exhibited in a low frequency region of 1 GHz or less. Accordingly, the noise suppressing structure 110 can exhibit the noise suppressing effects in a wide region from a low frequency to a high frequency of ten and several GHz. In order to increase the capacity of the capacitive laminated product by a method other than a method in which the dielectric constant is increased, the area of the first conductive layer 111 is enlarged, or the distance between the first conductive layer 111 and the second conductive layer 112 is narrowed.

As a method for forming an insulating layer, a conventional method may be selected depending on the material used. In the case of ceramic, a physical vapor deposition (PVD) method, a chemical vapor deposition (CVD) method, or the like, such as a sol-gel method, sputtering method, or the like, may be used. In the case of the organic material, a method in which a resin solution is directly applied on a conductive layer by performing spin coating, spray coating, or the like, a method in which an insulating layer gravure-coated on a base material with a releasability is transferred onto a conductive layer, or the like, may be used.

The noise suppressing structure 110 as described above exhibits excellent noise suppressing effects, because the noise suppressing layer 113 is a layer electromagnetically-coupled with the first conductive layer 111, containing a metallic material or conductive ceramic, and having a thickness of 5 to 300 nm, and the noise suppressing layer 113 and the first conductive layer 111 face each other at the region (I), but the noise suppressing layer 113 and the first conductive layer 111 do not face each other at the region (II) in which the noise suppressing layer 113 and the second conductive layer 112 face each other, the region (I) and region (II) neighboring each other.

Also, the noise suppressing structure 110 is not bulky and can be thinned, because the noise suppressing layer 113 is very thin.

When the noise suppressing structure according to the present invention is incorporated in an electronic element, the high-frequency current flowing into the conductive layer of the electronic element, which causes the conduction noise, can be suppressed, as a result of which the radiation noise can be obviated. The electronic element is equipped with conductors used for signal transmission, power supply, ground, or the like, and examples thereof include a semiconductor element, a semiconductor package such as a system-in-package (SIP) in which an electronic element such as the semiconductor element is mounted, a printed circuit board, and the like. In particular, a multilayer printed circuit board in which a semiconductor element is mounted is required to maintain the quality of waveform flowing to the signal transmission layer (signal integrity (SI)) on one hand, and required to decrease the power supply voltage so as to decrease electrical power consumption on the other hand, and thereby the signal to noise ratio (SN ratio) of a transmission signal deteriorates. Accordingly, it is required to stabilize the power supply (power integrity (PI)), and the suppression of high-frequency current is required. It is useful to apply the noise suppressing structure according to the present invention for the multilayer printed circuit board.

<Multilayer Printed Circuit Board>

The multilayer printed circuit board according to the present invention includes the noise suppressing structure according to the present invention. In the multilayer printed circuit board, the conductor of the noise suppressing structure serves as a signal transmission layer, power supply layer, or ground layer. In order to realize sufficient noise suppressing effects, it is preferable that either one of the first conductive layer and the second conductive layer serve as a power supply layer, and the other serve as a ground layer. There is a possibility in which the noise suppressing layer deteriorates fast pulse signal of the signal transmission layer by suppressing high-frequency components. Accordingly, it is preferable that either the power supply layer or the ground layer exists between the signal transmission layer and the noise suppressing layer.

Each thickness of the signal transmission layer, power supply layer, and ground layer is generally equal to that of the copper foil layer, and is generally within the range of 3 to 35 µm. The thickness of a prepreg or an adhesive sheet, which is to compose the second insulating layer, is generally within the range of 3 µm to 1.6 mm. In order to thin the multilayer printed circuit board, every layer tends to be thin.

The multilayer printed circuit board may be prepared as follows, for example.

An epoxy varnish or the like is applied on a copper foil layer, and then dried and hardened to form a power supply layer on which the first insulating layer is formed. On the first insulating layer, the noise suppressing layer is formed, and then etched to a predetermined pattern.

Then, a prepreg prepared by immersing an epoxy resin or the like in a glass fiber or the like and copper foil are laminated on the noise suppressing layer, followed by hardening the prepreg to form a core with the power supply layer and the ground layer (noise suppressing structure).

Then, the power supply layer or the ground layer on the core is etched to a predetermined pattern by a photolithography process. Then, copper foil is adhered to both outermost surfaces of the power supply layer and the ground layer through the prepreg to form each signal transmission layer, and thus a four-layered printed circuit board is obtained.

Figure 11:
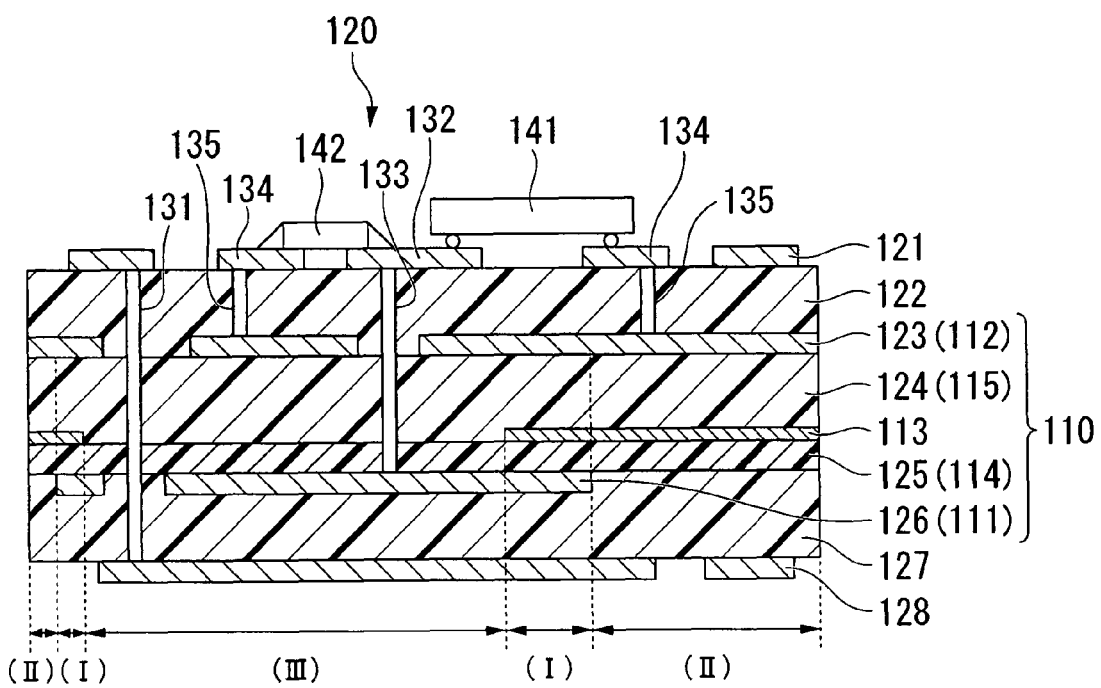
FIG. 11 is a cross-sectional view showing one aspect of a multilayer printed wiring board according to the present invention.

FIG. 11 is a cross-sectional view showing one aspect of the multilayer printed circuit board according to the present invention. The multilayer printed circuit board 120 is composed of a signal transmission layer 121, an insulating layer 122, a ground layer 123 (second conductive layer 112), an insulating layer 124 (second insulating layer 115), a noise suppressing layer 113, an insulating layer 125 (first insulating layer 114), a power supply layer 126 (first conductive layer 111), an insulating layer 127, and a signal transmission layer 128, in this order from the top thereof. The signal transmission layer 121 and the signal transmission layer 128 are connected through a through hole 131. A power supply line 132 and the power supply layer 126 is connected through a via hole 133. A ground line 134 and the ground layer 123 are connected through a via hole 135. On the power supply line 132 and the ground line 134, an electronic element 141 such as a semiconductor element or the like and a bypass condenser 142 are mounted.

In the multilayer printed circuit board 120 having a noise suppressing structure 110, the noise suppressing layer 113 and the power supply layer 126 (first conductive layer 111) face each other at the region (I), but the noise suppressing layer 113 and the power supply layer 126 (first conductive layer 111) do not face each other at the region (II) in which the noise suppressing layer 113 and the ground layer 123 (second conductive layer 112) face each other. Since the region (I) and the region (II) neighbor each other, the high-frequency current is suppressed, and the electric potential of the power supply layer 126 is stabilized, as a result of which the conduction noise such as simultaneous switching noise or the like, and the radiation noise caused by resonance can be suppressed.

As described above, the wiring member according to the present invention can stabilize the electric potential of the power supply and suppress the radiation of the unwanted noise by suppressing resonance between the power supply layer and the ground layer caused by simultaneous switching in a printed wiring board.

In the printed wiring board according to the present invention, the resonance between the power supply layer and the ground layer caused by the simultaneous switching is suppressed, the electric potential of the power supply is stabilized, and the radiation of the unwanted noise is suppressed.

In the noise suppressing structure and the multilayer printed wiring board according to the present invention, the generation of the conduction noise and the radiation noise is suppressed. Also, the noise suppressing structure and the multilayer printed wiring board can be thinned.

EXAMPLES

In the following, the present invention will be explained in more detail with reference to Examples and Comparative Examples. However, it should be apparent that the present invention is not limited to these examples.

Examples 1 to 3

(Thickness of Noise Suppressing Layer)
The thickness of a noise suppressing layer was measured at five points by observing a cross section of the noise suppressing layer using a transmission electron microscope manufactured by Hitachi, Ltd., under the trade name of H9000NAR and the measured values were averaged.
(Adhesive Strength)
The strength required for peeling a copper foil layer of a wiring member from an insulating resin layer was measured at a peeling rate of 50 mm/minutes and a peeling angle of 90° using a Tensilon tensile tester in accordance with JIS C5012.
(Noise Suppressing Effects)
A two-layered board composed of a ground layer and a power supply layer was prepared. At both ends of one of the power supply layer divided in two, SMA connectors linking to the power supply layer and the ground layer are mounted. S21 (transmission attenuation amount, unit: dB) was measured in accordance with a scattering parameter (S parameter) method using a network analyzer (manufactured by Anritsu Company under the trade name of 37247D) connected to the SMA connectors, and the resonance state of the S21 parameters was checked. When the noise suppressing effects were exhibited, the attenuation amount in the resonance frequency increases, and the graph illustrating the relationship between the attenuation amount and frequency becomes smooth.
(Resistance Between the Power Supply Layers)
The resistance between the two divided power supply layers was measured by applying a measuring voltage at 50V while putting probes on each of the divided two power supply layers using a super insulation meter manufactured by DKK-TOA CORPRATION under the trade name of SM-8210.

Example 1

Figure 12:
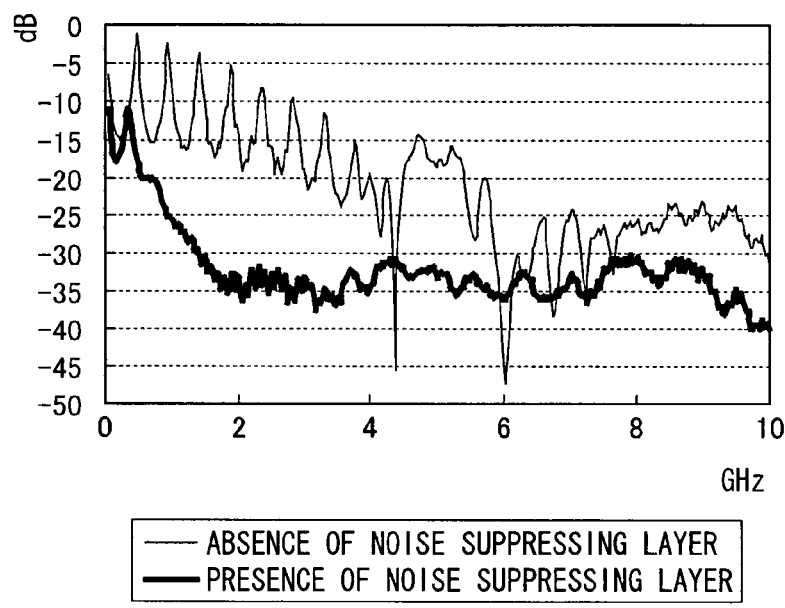
FIG. 12 is a graph indicating S21 (transmission attenuation amounts) of printed wiring boards of Example 1 and Comparative Example 3.

An electrolytic copper foil layer with a thickness of 35 µm had a smooth surface and a roughened surface. The surface roughness Rz of the smooth surface was 2 µm. In contrast, the surface roughness Rz of the roughened surface was 5.3 µm. On the smooth surface, a solution containing 1% by mass of 3-glycidoxypropyltrimethoxysilane was applied and dried to form an adhesion promoting layer.
30 parts by mass of bisphenol A type epoxy resin (manufactured by Japan Epoxy Resins Co., Ltd., under the trade name of 828), 30 parts by mass of bromine bisphenol A type resin (manufactured by Tohto Kasei Co., Ltd., under the trade name of YDB-500), and 35 parts by mass of cresol novolac resin (manufactured by Tohto Kasei Co., Ltd., under the trade name of YDCN-704) were dissolved in methyl ethyl ketone. Then, 0.2 parts by mass of imidazole-based hardening accelerator (manufactured by Shikoku Chemicals Corporation, under the trademark of CUREZOL 2E4MZ) were added to the solution to prepare a varnish containing 8% by mass of the resin composition.
The varnish of the resin composition was applied on the adhesion promoting layer using a gravure coater so that a coating film with a thickness of 10 µm was formed after being dried. After the coating film was dried in air for 15 minutes, the coating film was hardened by heating it at 150° C. for 15 minutes to form an insulating resin layer.
Then, a nickel metal was physically deposited on a whole area of the insulating resin layer by an EB deposition process. The insulating resin layer was further hardened by heating it at 150° C. for 45 minutes to form an uneven noise suppressing layer with a thickness of 15 nm having a surface shown in FIG. 2. Thus, a wiring member with a total thickness of 45 µm was obtained.
Strip specimens with a width of 10 mm and a length of 100 mm were cut off from the wiring member. Three sheets of the strip specimens were arranged in a width direction of a prepreg with a width of 35 mm, a length of 50 mm, and a thickness of 1 mm, and the strip specimens and the prepreg were adhered to each other by applying pressure, followed by measuring the peeling strength (adhesive strength) and observing the peeled state. Results thereof are shown in Table 1. The peeling strength was calculated by averaging three values of the strip specimens.
The wiring member was integrated with copper foil with a thickness of 35 µm via the prepreg with a thickness of 0.2 mm to prepare a two-layered board. A specimen with the dimensions of 74 mm×160 mm was cut off from the two-layered board. The wiring member side of the copper foil of the specimen was etched to divide a power supply layer in two portions with the dimensions of 36.5 mm×160 mm, the divided portions being placed with an interval of 1 mm. Each size of the noise suppressing layer and the ground layer was 74 mm×160 mm. The resistance between the power supply layers of the specimen was measured. Results thereof are shown in Table 1. S21 of the specimen was measured in accordance with a S parameter method. Results thereof are shown in FIG. 12.

Example 2

An electrolytic copper foil layer with a thickness of 18 µm had a smooth surface with a surface roughness Rz of 0.4 µm and a roughened surface with a surface roughness Rz of 5.3 µm. On the smooth surface, a solution containing 1% by mass of 3-mercaptopropyltrimethoxysilane was applied and dried to form an adhesion promoting layer.
95 parts by mass of a polyether sulphone resin (manufactured by Sumitomo Chemical Co., Ltd., under the trade name of PES5003P), 5 parts by mass of a bisphenol A type epoxy resin (manufactured by Japan Epoxy Resins Co., Ltd., under the trade name of 828EL), and 0.1 parts by mass of an imidazole hardening accelerator (manufactured by Shikoku Chemicals Corporation., under the trademark of CUREZOL 2MZ) were dissolved in a solvent containing N,N-dimethylformamide and cyclohexane at a mass ratio of 50/50 to prepare a varnish A containing 0.5% by mass of the resin composition.
The varnish A was applied on the adhesion promoting layer so that a coating film with a thickness of 1 µm was formed after being dried. After the coating film was dried in air for 10 minutes, the coating film was hardened by heating it at 160° C. for 10 minutes to form an insulating resin layer A.
26 parts by mass of a bisphenol A type epoxy resin (manufactured by Japan Epoxy Resins Co., Ltd., under the trade name of 834), 20 parts by mass of a bisphenol A type phenoxy resin (manufactured by Japan Epoxy Resins Co., Ltd., under the trade name of 1256), 35 parts by mass of a cresol novolac resin (manufactured by Tohto Kasei Co., Ltd., under the trade name of YDCN-704) were dissolved in a methyl ethyl ketone, to which 0.2 parts by mass of an imidazole type hardening accelerator (manufactured by Shikoku Chemicals Corporation, under the trademark of CUREZOL 2E4MZ) to prepare a varnish B containing 4% by mass of the resin composition.

The varnish B was applied on the insulating resin layer A using a gravure coater so that a coating film with a thickness of 2 μm was formed after being dried. After the coating film was dried in air for 10 minutes, the coating film was hardened by heating it at 150° C. for 15 minutes to form an insulating resin layer B.

Then, a tantalum metal was physically deposited on a whole area of the insulating resin layer B while inpouring nitrogen therein by a magnetron sputtering process. The insulating resin layer was further hardened by heating it at 150° C. for 45 minutes to form an uneven noise suppressing layer with a thickness of 20 nm. Thus, a wiring member with a total thickness of 21 μm was obtained.

The wiring member was evaluated by measuring the peeling strength and observing the peeled state thereof in the same way as that of Example 1. Results thereof are shown in Table 1.

Figure 13:
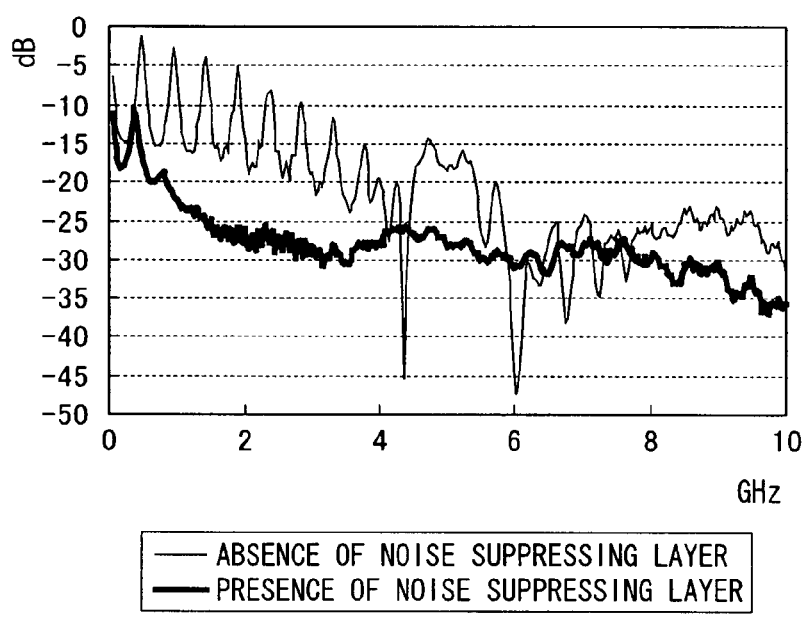
FIG. 13 is a graph indicating S21 (transmission attenuation amounts) of printed wiring boards of Example 2 and Comparative Example 3.

The wiring member and copper foil with a thickness of 18 μm were integrated via a prepreg with a thickness of 0.1 mm to form a two-layered board. In the same way as that of Example 1, a power supply layer of the two-layered board was divided in two portions to make specimens, and the resistance between the divided power supply layers was measured. Results thereof are shown in Table 1. Also, S21 of the specimen was measured by a S parameter method. Results thereof are shown in FIG. 13.

Comparative Example 1

In a similar way to that of Example 1, a wiring member with a total thickness of 45 μm was prepared, except that a roughened electrolytic copper foil layer with a thickness of 35 μm, the surface roughness Rz of both-surfaces thereof being 5.3 μm, was used, and no adhesion promoting layer was formed. The wiring member was evaluated by measuring the peeling strength and observing the peeled state in the same way as that of Example 1. Results thereof are shown in Table 1.

In the same way as that of Example 1, a two-layered board was prepared using the wiring member, specimens were prepared, and then the resistance between power supply layers was measured. Results thereof are shown in Table 1. S21 by the S parameters method was not performed.

Example 3

In a similar way to that of Example 1, a wiring member was prepared, except that no adhesion promoting layer was formed, and the thickness of an insulating resin layer was 25 μm. The wiring member was evaluated by measuring the peeling strength and observing the peeled state in the same way as that of Example 1. Results thereof are shown in Table 1.

Figure 14:
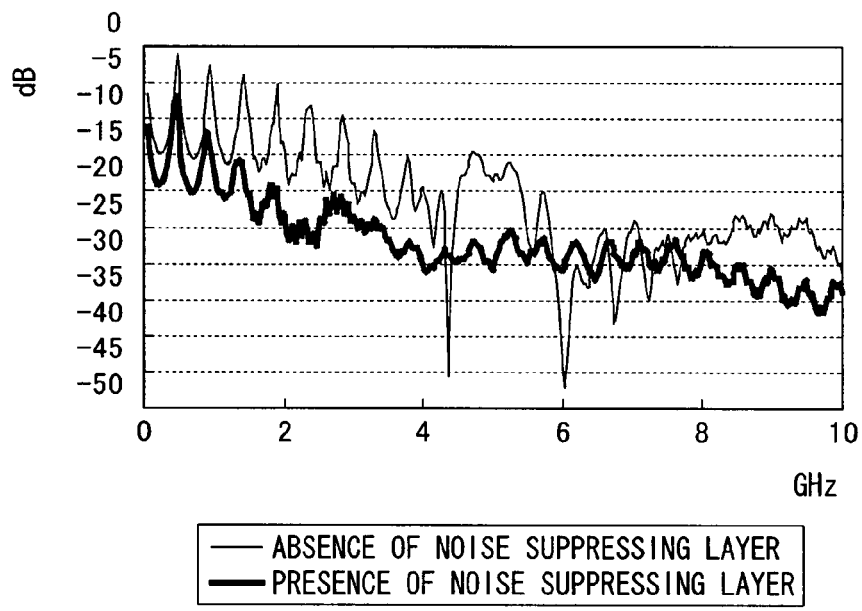
FIG. 14 is a graph indicating S21 (transmission attenuation amounts) of printed wiring boards of Example 3 and Comparative Example 3.

In the same way as that of Example 1, a two-layered board was prepared using the wiring member, specimens were prepared, and then the resistance between power supply layers was measured. Results thereof are shown in Table 1. S21 was measured by the S parameters method. Results thereof are shown in FIG. 14.

Comparative Example 2

In a similar way to that of Example 2, a wiring member with a total thickness of 18 μm was prepared, except that a noise suppressing layer was directly formed on a copper foil layer without forming any insulating resin layers. The wiring member was evaluated by measuring the peeling strength and observing the peeled state in the same way as that of Example 1. Results thereof are shown in Table 1.

Figure 15:
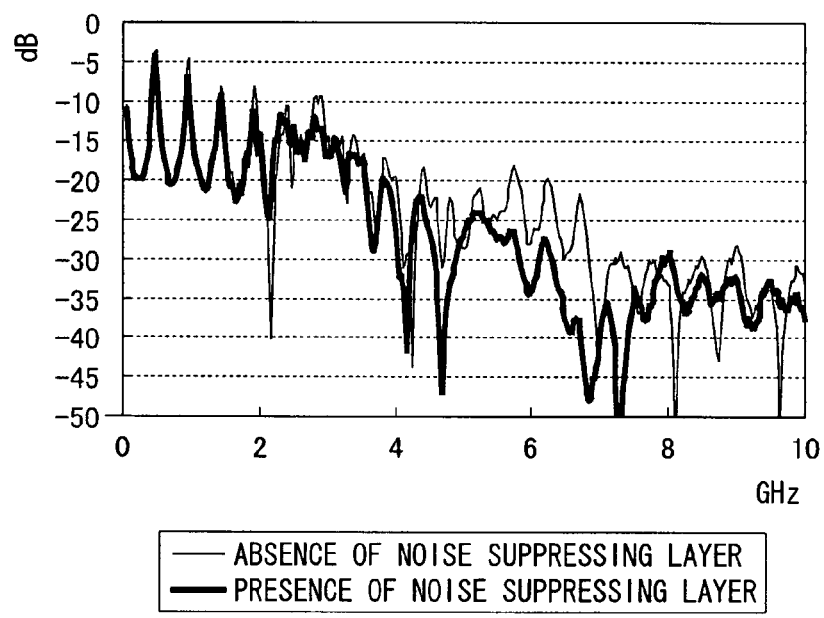
FIG. 15 is a graph indicating S21 (transmission attenuation amounts) of printed wiring boards of Comparative Example 2 and Comparative Example 4.

In the same way as that of Example 1, a two-layered board was prepared using the wiring member. Although a power supply layer of the two-layered board was divided in two portions to prepare specimens, the noise suppressing layer was also divided in two portions with the same size as that of the divided power supply layers (36.5 mm×160 mm) due to the absence of the insulating resin layer. The size of the ground layer was 74 mm×160 mm. The resistance between the power supply layers of the specimens was measured. Results thereof are shown in Table 1. S21 of the specimens was measured by an S parameters method. Results thereof are shown in FIG. 15.

Comparative Example 3

In a similar way to that of Example 1, a wiring member was prepared, except that no noise suppressing layer was formed. In the same way as that of Example 1, a two-layered board was prepared using the wiring member, specimens were prepared, and S21 was measured by a S parameter method. Results thereof are shown in FIGS. 12 to 14.

Comparative Example 4

In a similar way to that of Comparative Example 2, a wiring member was prepared, except that no noise suppressing layer was formed. In the same way as that of Example 1, a two-layered board was prepared using the wiring member, specimens were prepared, and S21 was measured by a S parameter method. Results thereof are shown in FIG. 15.

TABLE 1

| | Peeling Strength (kgf/cm) | Peeled State | Resistance × $10^{12}$ (Ω) | Evaluation |
|---|---|---|---|---|
| Example 1 | 1.18 | Peeling almost occurred at the copper foil side due to disruption of the base material of the insulating resin layer. | 2.1 | Short-circuit between the copper foil layer and the noise suppressing layer was not recognized, and insulation between the divided power supply layers |
| Example 2 | 0.97 | Peeling almost occurred at the copper foil side due to disruption of the base material of the insulating resin layer. | 3.6 | was maintained. Sufficient adhesive strength and excellent noise suppressing effects were recognized. |

TABLE 1-continued

| | Peeling Strength (kgf/cm) | Peeled State | Resistance × $10^{12}$ (Ω) | Evaluation |
|---|---|---|---|---|
| Comparative Example 1 | 1.07 | Peeling almost occurred at the copper foil side due to disruption of the base material of the insulating resin layer. | Unmeasurable due to occurrence of leak | Surface condition of the copper foil layer was unfavorable, a pin hole was recognized in the insulating resin layer, and short-circuit was recognized. |
| Example 3 | 0.68 | Peeling occurred at an interface between the copper foil layer and the insulating resin layer, and disruption of the base material of the insulating resin layer was not recognized. | 2.8 | Adhesive strength between the copper foil layer and the insulating resin layer was weak. Although the noise suppressing layer was slightly separated from the power supply layer, noise suppressing effects were recognized. |
| Comparative Example 2 | 0.26 | Peeling occurred at interface between the copper foil layer and the noise suppressing layer. | 3.1 | Adhesive condition between the noise suppressing layer and the copper foil layer was particularly unfavorable. The noise suppressing layer with sufficient size was not formed, and noise suppressing effects were insufficient. |

Examples 4 to 10

(Thickness of Noise Suppressing Layer)

The thickness of each noise suppressing layer was measured at five points by observing a cross section of the noise suppressing layer using a transmission electron microscope manufactured by Hitachi, Ltd., under the trade name of H9000NAR, and the measured values were averaged.

(Measurement of S21 Parameters)

S parameters between SMA connectors of each specimen was measured using a vector network analyzer manufactured by Anritsu Company under the trade name of 37247D.

(Measurement of Voltage)

The voltage of each power supply layer was measured using a spectrum analyzer equipped with a tracking generator manucatured by Advantest Corporation under the trade name of R3132.

Example 4

On a copper foil layer (first conductive layer) with a thickness of 18 μm, an epoxy-based varnish was applied, dried, and hardened, to form a first insulating layer with a thickness of 3 μm. The surface resistance of the first insulating layer was $8 \times 10^{12}$ Ω.

Then, a nickel metal was physically deposited on the whole surface of the first insulating layer under a nitrogen gas atmosphere by a reactive sputtering method to form an uneven noise suppressing layer with a thickness of 30 nm containing a nickel nitride. The surface resistance of the noise suppressing layer was 97 Ω.

On the noise suppressing layer, an epoxy-based prepreg with a thickness of 100 μm (second insulating layer, with a surface resistance of $6 \times 10^{14}$ Ω) and a copper foil layer with a thickness of 18 μm (second conductive layer) were laminated, and then the prepreg was hardened to prepare a two-layered board.

Figure 16:
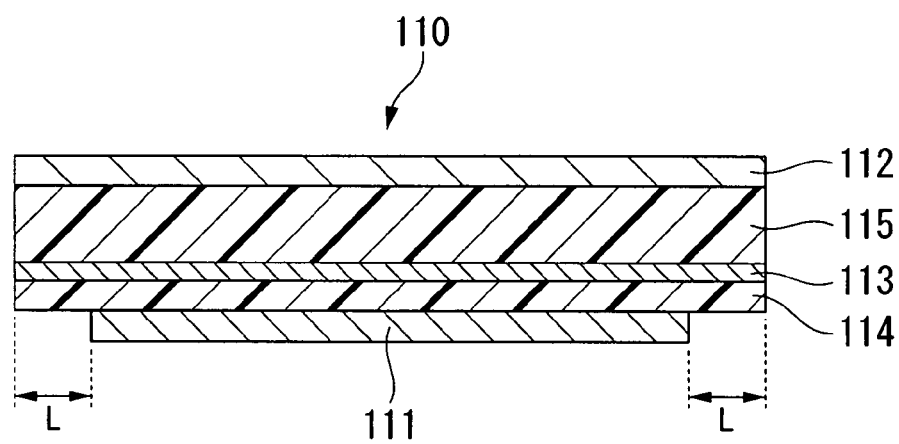
FIG. 16 is a cross-sectional view showing a noise suppressing structure prepared in Examples 4 to 6.

A specimen with the dimensions of 74 mm×160 mm was cut off from the two-layered board, and both end portions of the first conductive layer of the specimen along a longitudinal direction were etched to prepare a noise suppressing structure 110 having a region (II) with an average width (L) of 1.5 mm as shown in FIG. 16.

Figure 17:
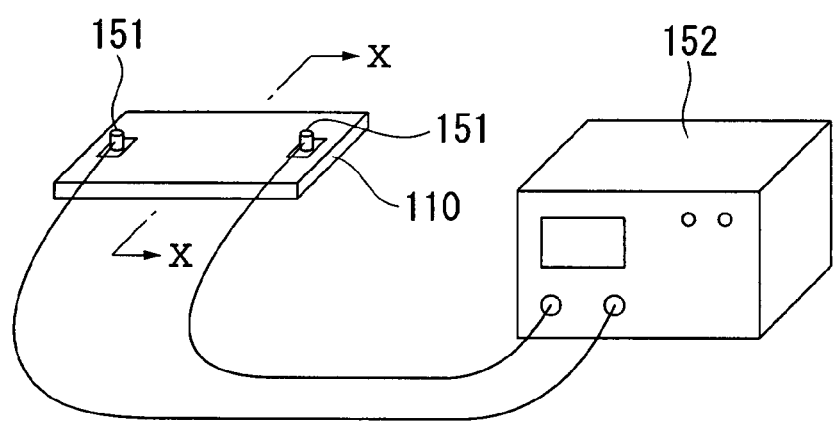
FIG. 17 is a schematic diagram showing a system for measuring S parameters.
Figure 18:
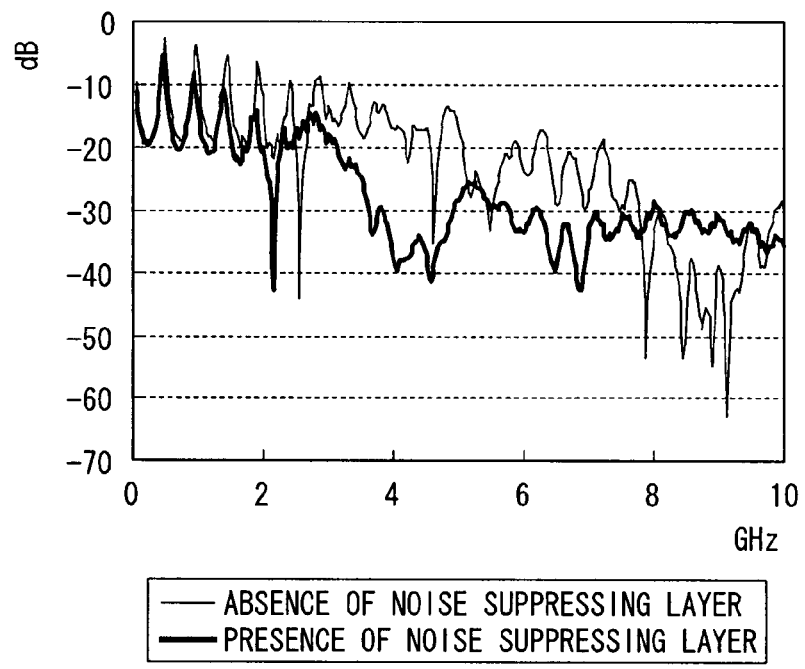
FIG. 18 is a graph indicating S21 (transmission attenuation amounts) of Example 4 and Comparative Example 5.

As shown in FIG. 17, SMA connectors 151 connecting to the first conductive layer 111 and the second conductive layer 112 were mounted on both end portions of the noise suppressing structure 110 in a longitudinal direction. To the SMA connectors 151, a vector network analyzer 152 was connected to measure S parameters at 400 points within a frequency range of 50 MHz to 10 GHz, followed by making a graph. The graph is shown in FIG. 18. The values measured at the 400 points were summed as a pseudointegration value.

Comparative Example 5

A two-layered board was prepared in a similar way to that of Example 4, except that no noise suppressing layer was formed. In the same way as that of Example 4, a specimen was cut off from the two-layered board, and a copper foil layer of a first conductive layer was etched. In the same way as that of Example 4, S parameters of the specimen was measured to make a graph. The graph is shown in FIG. 18. As a pseudointegration value, the values measured at 400 points were summed. The difference (absolute value) between the pseudointegration value of Example 4 and that of Comparative Example 5 is shown in Table 2. The noise suppressing effects of the noise suppressing structure 110 of Example 4 increase in accordance with the increase of the absolute value.

Example 5

Figure 19:
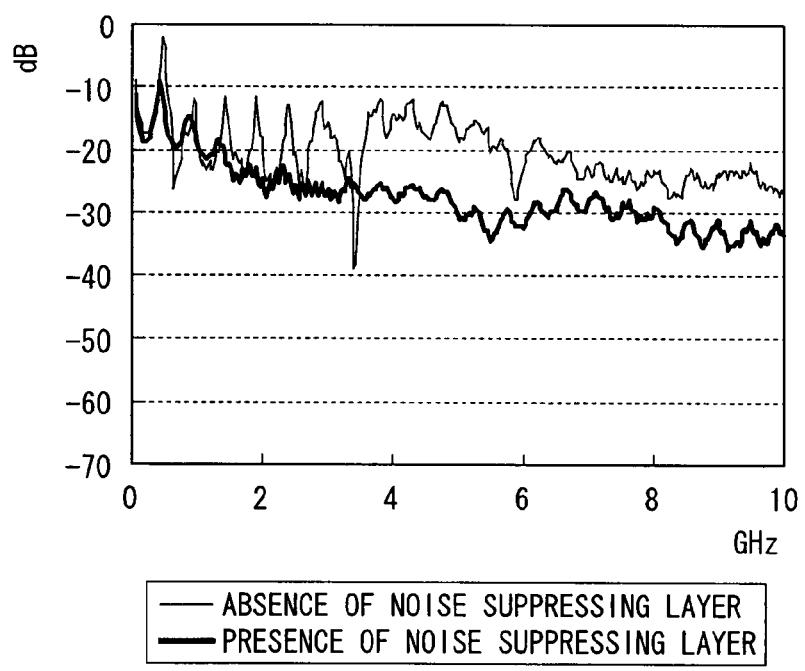
FIG. 19 is a graph showing S21 (transmission attenuation amounts) of Example 5 and Comparative Example 6.

A noise suppressing structure 110 was prepared in a similar way to that of Example 4, except that the average width (L) of the region (II) shown in FIG. 16 was 9 mm. In the same way as that of Example 4, S parameters of the noise suppressing structure 110 were measured and a graph was made. The graph is shown in FIG. 19. As a pseudointegration value, the values measured at 400 points were summed.

Comparative Example 6

A two-layered board was prepared in a similar way to that of Example 4, except that no noise suppressing layer was formed. In the same way as that of Example 4, a specimen was cut off from the two-layered board, and a copper foil layer of a first conductive layer was etched in the same way as that of Example 5. In the same way as that of Example 4, S parameters of the specimen were measured and a graph was made. The graph is shown in FIG. 19. As a pseudointegration value, the values measured at 400 points were summed. The difference (absolute value) between the pseudointegration value of Example 5 and that of Comparative Example 6 is shown in Table 2.

Example 6

Figure 20:
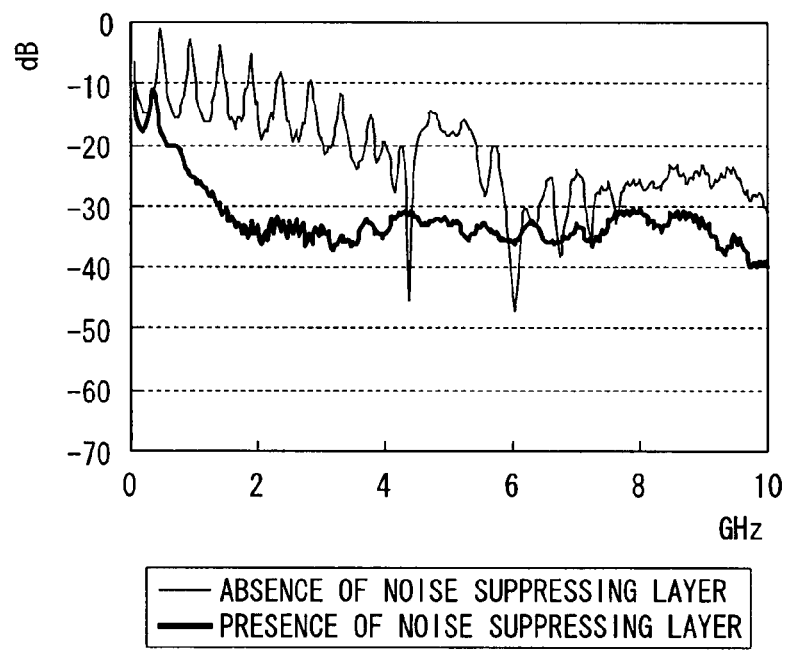
FIG. 20 is a graph showing S21 (transmission attenuation amounts) of Example 6 and Comparative Example 7.

A noise suppressing structure 110 was prepared in a similar way to that of Example 4, except that the average width (L) of the region (II) shown in FIG. 16 was 18 mm. In the same way as that of Example 4, S parameters of the noise suppressing structure 110 were measured and a graph was made. The graph is shown in FIG. 20. As a pseudointegration value, values measured at 400 points were summed.

Comparative Example 7

A two-layered board was prepared in a similar way to that of Example 4, except that no noise suppressing layer was formed. A specimen was cut off from the two-layered board in the same way as that of Example 4, and a copper foil layer of a first conductive layer was etched in the same way as that of Example 6. In the same way as that of Example 4, S parameters of a specimen were measured and a graph was made. The graph is shown in FIG. 20. As a pseudointegration value, values measured at 400 points were summed. The difference (absolute value) between the pseudointegration value of Example 6 and that of Comparative Example 7 is shown in Table 2.

Comparative Example 8

Figure 21:
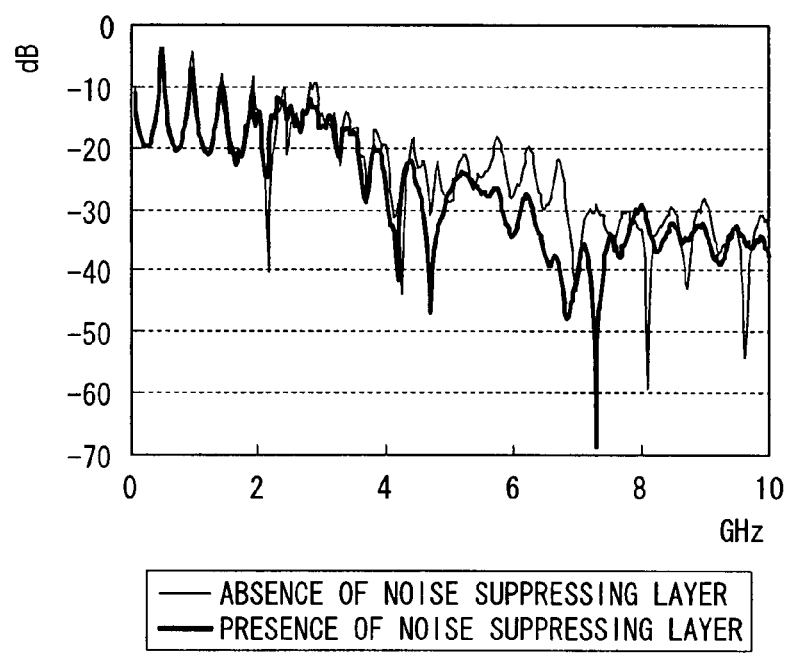
FIG. 21 is a graph showing S21 (transmission attenuation amounts) of Comparative Example 8 and Comparative Example 9.

A specimen was prepared in a similar way to that of Example 4, except that a copper foil layer of a first conductive layer was not etched. The average width (L) of the region (II) of the specimen as shown in FIG. 16 was 0 mm. S parameters of the specimen were measured and a graph was made. The graph is shown in FIG. 21. As a pseudointegration value, values measured at 400 points were summed.

Comparative Example 9

A two-layered board was prepared in a similar way to that of Example 4, except that no noise suppressing layer was formed. In the same way as that of Example 4, a specimen was cut off from the two-layered board. A copper foil layer of a first conductive layer of the specimen was not etched. In the same way as that of Example 4, S parameters of the specimen were measured and a graph was made. The graph is shown in FIG. 21. As a pseudointegration value, values measured at 400 points were summed. The difference (absolute value) between the pseudointegration value of Comparative Example 8 and that of Comparative Example 9 is shown in Table 2.

Example 7

A two-layered board was prepared in a similar way to that of Example 4, except that the thickness of the noise suppressing layer was 20 nm. A large specimen with the dimensions of 100 mm×200 mm was cut off from the two-layered board, and both ends of a copper foil layer of a first conductive layer of the specimen along a longitudinal direction was etched to prepare a noise suppressing structure 110 in which the region (II) had an average width (L) of 30 mm as shown in FIG. 16. In each first conductive layer, second conductive layer, and noise suppressing layer, an anti-pad was formed for preventing each layer from contacting to a through hole before laminating each layer.

The first conductive layer 111 of the noise suppressing structure 110 was made a power supply layer and the second conductive layer 112 was made a ground layer. To both outermost surfaces of the power supply layer and the ground layer, copper foil with a thickness of 18 µm was adhered via epoxy-based prepregs with a thickness of 50 µm to form each signal transmission layer. Then, each signal transmission layer was etched to a predetermined shape as shown in FIGS. 22 and 23.

Figure 22:
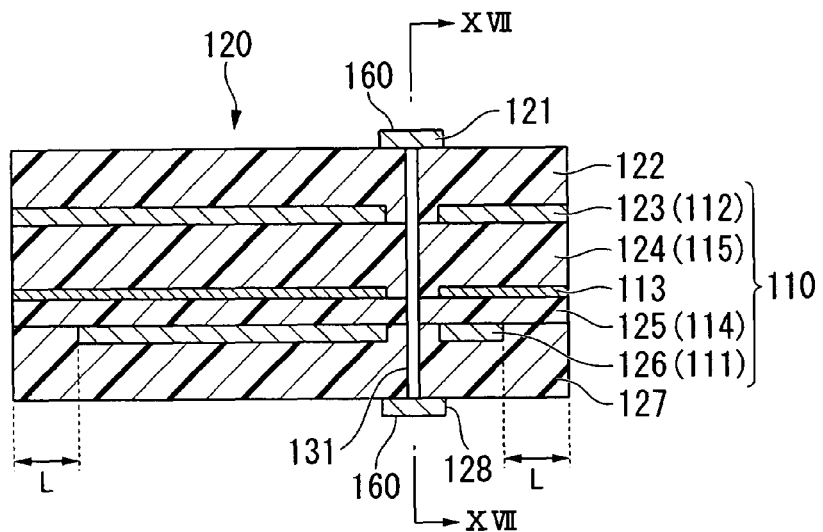
FIG. 22 is a cross-sectional view showing a multilayer printed wiring board of Example 7.
Figure 23:
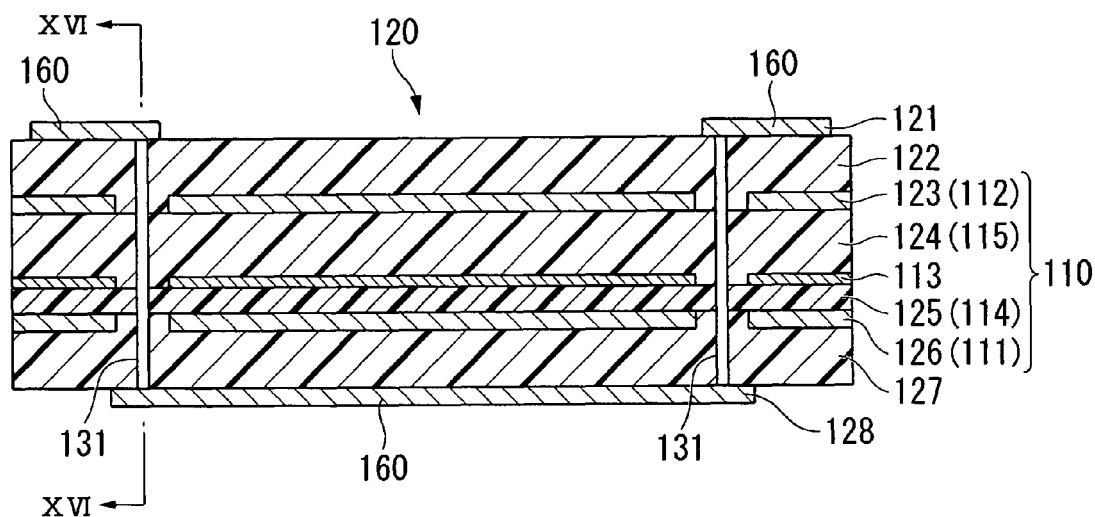
FIG. 23 is a cross-sectional view of the multilayer printed wiring board sliced by the XVII-XVII face shown in FIG. 22.

As shown in FIGS. 22 and 23, a through hole 131 is formed in the anti-pad to form a signal line 160 with an impedance of 50 Ω, the signal line 160 having a structure in which the through hole 131 passes from a signal transmission layer 121 to a signal transmission layer 128 and then returns to the signal transmission layer 121 again, and thus a multilayer printed wiring board 120 was prepared.

Figure 24:
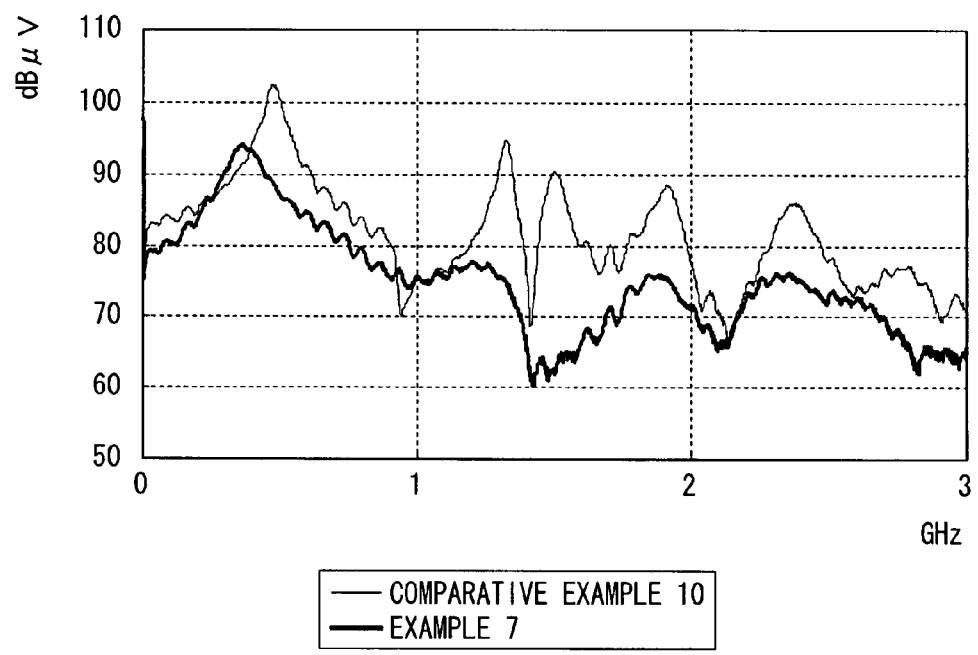
FIG. 24 is a graph showing a voltage variation of power supply layers of Example 7 and Comparative Example 10.

An input SMA connector was connected to the signal line 160 and the ground layer 123, and an output SMA was connected to the power supply layer 126 and the ground layer 123. Signals with a frequency from 50 MHz to 3 GHz were input to the signal line 160 using a spectrum analyzer equipped with a tracking generator, and the voltage variation of the power supply layer 126 at that time was measured. Results of the measurement are shown in FIG. 24.

Comparative Example 10

A multilayer printed wiring board was prepared in a similar way as that of Example 7, except that the average width (L) of the region (II) was 0 mm. In the same way as that of Example 7, the voltage variation of the power supply layer was measured. Results thereof are shown in FIG. 24.

It becomes apparent from the comparison of the results of Example 7 and Comparative Example 10 that when the power

TABLE 2

|  | Example 1 | Example 2 | Example 3 | Comparative Example 4 |
|---|---|---|---|---|
| Dimensions of noise suppressing structure (mm × mm) | 74 × 160 | 74 × 160 | 74 × 160 | 74 × 160 |
| Dimensions of second conductive layer (mm × mm) | 74 × 160 | 74 × 160 | 74 × 160 | 74 × 160 |
| Dimensions of noise suppressing layer (mm × mm) | 74 × 160 | 74 × 160 | 74 × 160 | 74 × 160 |
| Average width (L) of region (II) (mm) | 1.5 | 9 | 18 | 0 |
| Dimensions of first conductive layer (mm × mm) | 68 × 160 | 56 × 160 | 38 × 160 | 74 × 160 |
| Difference of pseudointegration values | 1772 | 2783 | 4311 | 689 |

As is apparent from the results shown in Table 2, the noise suppressing effects increase in accordance with the decrease in the size of the first conductive layer 111 or the increase in the average width (L) of the region (II). No noise suppressing effects of the specimen free from the region (II), which was prepared in Example 8, was recognized.

supply layer (first conductive layer) was small and the average width (L) of the region (II) was large, the excitation of the power supply layer caused by signals with a high-frequency was suppressed. In Comparative Example 10 in which the region (II) was not formed, no noise suppressing effects were recognized.

Example 8

Figure 25:
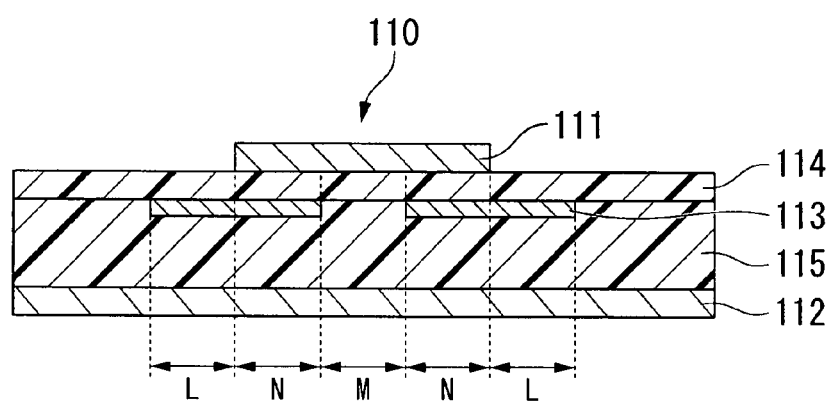
FIG. 25 is a cross-sectional view showing a noise suppressing structure of Example 8.

As shown in a cross-sectional view of FIG. 25, a noise suppressing structure 110 including: a first conductive layer 111 with a width of 25 mm, a length of 60 mm, and a thickness of 12 μm; a second conductive layer 112 with a width of 60 mm, a length of 60 mm, and a thickness of 12 μm; a first insulating layer 114 (with a surface resistance of $2 \times 10^9$ Ω) with a width of 60 mm, a length of 60 mm, and a thickness of 0.1 μm; and a second insulating layer 115 (with a surface resistance of $3 \times 10^{14}$ Ω) with a width of 60 mm, a length of 60 mm, and a thickness of 50 μm; was prepared.

A noise suppressing layer 113 was formed by physically depositing silver on the first insulating layer 114 by an electron beam (EB) deposition process, so that the average width (L) of the region (II) was 3 mm, and the average width (M) of the region (III) was 0 mm, and the thickness thereof was 15 nm. The surface resistance of the noise suppressing layer 113 was 55 Ω.

Figure 26:
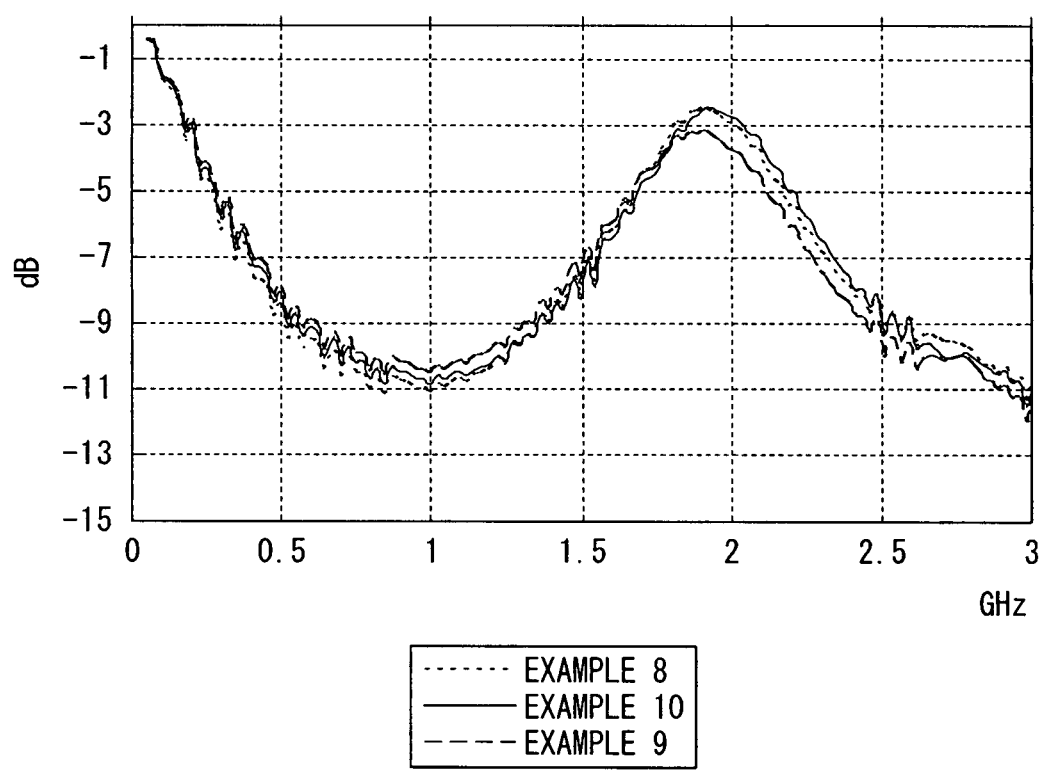
FIG. 26 is a graph showing S21 (transmission attenuation amounts) of Examples 8 to 10.

In the same way as that of Example 4, S parameters of the noise suppressing structure 110 were measured, and a graph thereof was made. The graph is shown in FIG. 26. As a pseudointegration value, values measured at 400 points were summed. The difference (absolute value) between the pseudointegration value and a pseudointegration value calculated when no noise suppressing layer was formed is shown in Table 3.

Example 9

A noise suppressing structure 110 was prepared in a similar way to that of Example 8, except that the noise suppressing layer 113 was formed so that the average width (M) of the region (III) was 15 mm. In the same way as that of Example 4, S parameters of the noise suppressing structure 110 were measured, and a graph thereof was formed. The graph is shown in FIG. 26. As a pseudointegration value, values measured at 400 points were summed. The difference (absolute value) between the pseudointegration value and a pseudointegration value calculated when no noise suppressing layer was formed is shown in Table 3.

Example 10

A noise suppressing structure 110 was prepared in a similar way to that of Example 8, except that a noise suppressing layer 113 was formed so that the average width (M) of the region (III) was 23 mm. In the same way as that of Example 4, S parameters of the noise suppressing structure 110 were measured and a graph thereof was made. The graph is shown in FIG. 26. As a pseudointegration value, values measured at 400 points were summed. The difference between the pseudointegration value and a pseudointegration value calculated when no noise suppressing layer was formed is shown in Table 3.

TABLE 3

|  | Example 5 | Example 6 | Example 7 |
| --- | --- | --- | --- |
| Dimensions of noise suppressing structure (mm × mm) | 60 × 60 | 60 × 60 | 60 × 60 |
| Dimensions of first conductive layer (mm × mm) | 25 × 60 | 25 × 60 | 25 × 60 |
| Dimensions of second conductive layer (mm × mm) | 60 × 60 | 60 × 60 | 60 × 60 |
| Average width (L) of region (II) (mm) | 3 | 3 | 3 |
| Average width (M) of region (III) (mm) | 0 | 15 | 23 |
| Average width (N) of region (I) (mm) | 25 | 5 | 1 |
| Difference of pseudointegration values | 4597 | 4453 | 4804 |

As is apparent from results shown in Table 3, when the region (I) exists at least in periphery end portions of the first conductive layer 111, the noise suppressing effects were exhibited without depending on the average width (N) of the region (I).

As described above, the wiring member according to the present invention is useful as a member composing a printed wiring board which powers or signals a semiconductor element such as IC, LSI, or the like, an electronic element, or the like.

Also, the noise suppressing structure and the multilayer printed wiring board according to the present invention are useful as a multilayer printed wiring board which powers or signals a semiconductor element such as IC, LSI, or the like, a power supply layer in an electronic element, and the electronic element.

What is claimed is:

1. A noise suppressing structure comprising:
a first conductive layer;
a second conductive layer;
a noise suppressing layer provided between the first conductive layer and the second conductive layer, the noise suppressing layer being electromagnetically-coupled with the first conductive layer, the noise suppressing layer comprising a metallic material or a conductive ceramic, and the noise suppressing layer having a thickness of 5 to 300 nm;
a first insulating layer provided between the first conductive layer and the noise suppressing layer;
a second insulating layer provided between the second conductive layer and the noise suppressing layer, and the noise suppressing layer is formed on the first insulating layer and the second insulating layer,
wherein the noise suppressing structure comprises:
a first region in which the noise suppressing layer and the first conductive layer face each other; and
a second region in which the noise suppressing layer and the first conductive layer do not face each other but the noise suppressing layer and the second conductive layer face each other,
the first and second regions neighboring each other,
wherein the noise suppressing layer includes portions free of the metallic material and the conductive ceramic.

2. A noise suppressing structure according to claim 1, wherein the noise suppressing layer has an area substantially equal to that of the second conductive layer.

3. A noise suppressing structure according to claim 1, wherein
the first region is provided at periphery end portions of the first conductive layer; and a third region comprising the first conductive layer positioned so as to avoid facing the noise suppressing layer.

4. A noise suppressing structure according to claim 1, wherein the first conductive layer is divided into a plurality of parts.

5. A noise suppressing structure according to claim 1, wherein the first insulating layer has a thickness of 0.05 to 25 µm.

6. A noise suppressing structure according to claim 5, wherein the first insulating layer has a relative dielectric constant of 2 or more.

7. A noise suppressing structure according to claim 1, wherein the first region has an average width of 0.1 mm or more, the average width being calculated in accordance with a formula:

the average width (mm) of the first region=an area (mm$^2$) of the first region/a length (mm) of a boundary line between the first region and the second region.

8. A noise suppressing structure according to claim 1, wherein the second region has an average width of 1 to 50 mm, the average width being calculated in accordance with a formula:

the average width (mm) of the second region=an area (mm$^2$) of the second region/a length (mm) of a boundary line between the first region and the second region.

9. A multilayer printed wiring board comprising the noise suppressing structure of claim 1.

10. A multilayer printed wiring board of claim 9, wherein one of the first conductive layer and the second conductive layer is a power supply layer, and the other is a ground layer.

11. A multilayer printed wiring board of claim 10, further comprising a signal transmission layer, wherein either the power supply layer or the ground layer is positioned between the signal transmission layer and the noise suppressing layer.

12. A multilayer printed wiring board of claim 9, wherein the noise suppressing structure is a capacitive laminated product.

* * * * *